United States Patent
Uenishi et al.

(10) Patent No.: US 6,803,173 B2
(45) Date of Patent: Oct. 12, 2004

(54) POSITIVE RESIST COMPOSITION

(75) Inventors: Kazuya Uenishi, Shizuoka (JP); Kunihiko Kodama, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 109 days.

(21) Appl. No.: 10/341,406

(22) Filed: Jan. 14, 2003

(65) Prior Publication Data

US 2003/0170562 A1 Sep. 11, 2003

(30) Foreign Application Priority Data

Jan. 16, 2002 (JP) ........................... P.2002-007635

(51) Int. Cl.⁷ .............................................. G03F 7/004
(52) U.S. Cl. ..................... 430/270.1; 430/905; 430/921
(58) Field of Search .............................. 430/270.1, 905, 430/921

(56) References Cited

U.S. PATENT DOCUMENTS 5,856,071 A 1/1999 Kotachi et al.
5,998,557 A 12/1999 Choi
2003/0194650 A1 * 10/2003 Kanna et al. ............. 430/285.1

FOREIGN PATENT DOCUMENTS

| EP | 494383 | 9/1991 |
| JP | 7-99435 | 10/1995 |
| JP | 2001-117233 | * 4/2001 |

OTHER PUBLICATIONS

JPO abstract of JP 2001-117233, Apr. 2001.*

* cited by examiner

*Primary Examiner*—Rosemary Ashton
(74) *Attorney, Agent, or Firm*—Sughrue Mion, PLLC

(57) ABSTRACT

A positive resist composition comprising: (A) a polymer having a silicon atom in a side chain thereof, which is insoluble or sparingly soluble in an aqueous alkali solution and becomes soluble in an aqueous alkali solution by an action of an acid; and (B) an acid generator capable of generating an acid on exposure to active light rays or a radiation, which is represented by the formula (I) defined in the present specification.

16 Claims, No Drawings

POSITIVE RESIST COMPOSITION

FIELD OF THE INVENTION

This invention relates to a positive-working silicon-containing resist composition adapted to be exposed to radiations such as ultraviolet rays, far ultraviolet rays, X-rays, electron beams, molecular beams, γ-rays, and synchrotron rays. More particularly, it relates to a positive silicon-containing resist composition for micro-patterning which exhibits high resolution and high sensitivity to provide a resist having a rectangular profile with broad process latitude and is useful in the fabrication of semiconductor devices such as ICs, for example, in the fabrication of printed wiring boards.

A positive resist composition is used in, for example, processes comprising the steps of applying a positive resist composition to a substrate, such as a semiconductor wafer or a glass, ceramic or metal plate, either directly or via an antireflection coat or an organic coat by spin coating or roller coating to a thickness of 0.01 to 3 μm, heat drying the applied composition to form a resist film, imagewise exposing the resist film through a photomask having a circuit or like pattern to active light rays, etc. developing the resist film to form a positive resist, and patternwise etching the substrate using the resist as a mask. Typical applications of a positive resist composition include fabrication of semiconductor devices, e.g., ICs, fabrication of circuit wiring boards for liquid crystals, thermal heads, etc., and other photofabrication techniques.

BACKGROUND OF THE INVENTION

The increasing integrity of LSIs has revealed the resolution limits of conventional single layer resists, and multilayer resist lithography has been proposed to form a thick and yet fine pattern having a high aspect ratio. According to the multilayer resist lithography technique, a thick organic polymer layer (first layer) is formed on a substrate, and a thin resist layer is provided thereon to form a second layer, which is exposed to high energy rays and developed to form a resist pattern. The first layer of the organic polymer is then anisotropically etched by oxygen plasma ($O_2$-RIE) using the resist pattern as a mask thereby to make a pattern with high rectangularity (see Lin, *Solid State Technology*, 1981, 24, 73).

The above-described two-layer resist process has an advantage that the second resist layer can be applied thin so that the resulting resist pattern is expected to have a high resolution, a high aspect ratio, and a larger depth of focus (DOF). Because the second resist layer must have high resistance to $O_2$-RIE, it is generally formed of a silicon-containing polymer. In particular, many attempts have been directed to use of acid-degradable group-containing vinyl polymers having a silicon atom in the side chain thereof from the standpoint of wide freedom of molecular design and availability or ease of synthesis of starting materials. Such attempts are found, e.g., in JP-B-7-99435, EP494383, and U.S. Pat. Nos. 5,998,557 and 5,856,071.

Nevertheless the studies that have hitherto been given to the two-layer resist process have not succeeded in simultaneously satisfying the requirements of resolution, DOF, and freedom from development defects in ultrafine patterning.

Further, where the state-of-the-art two-layer resist process is applied to fine pattern formation on a silicon wafer using, for example, an ArF laser as an exposure light source at near the resolution limit of 0.14 μm or narrower, the resulting resist pattern has insufficient dimensional uniformity. When it comes to contact hole pattern formation, in particular, variation in shape and size of the contact holes has posed a problem. If a resist pattern has varied dimensions from place to place in a plane, the variation would be transferred to the substrate in etching, resulting in deterioration of electrical characteristics, which leads to a reduced yield.

SUMMARY OF THE INVENTION

An object of the present invention is to provide a positive resist composition adapted to be exposed to far ultraviolet rays from an ArF laser or a KrF laser which provides a resist pattern with improved dimensional uniformity and excellent resist characteristics, such as resolution, DOF, and freedom from development defects.

The present inventors have conducted extensive studies paying attention to these performance properties and reached the present invention. The object of the invention is accomplished by:

(1) A positive resist composition comprising (A) a polymer having a silicon atom in the side chain thereof which is insoluble or sparingly soluble in an aqueous alkali solution and becomes soluble in an aqueous alkali solution by the action of an acid and (B) an acid generator capable of generating an acid on exposure to active light rays or a radiation which is represented by formula (I):

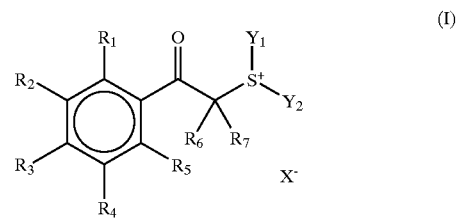

wherein $R_1$, $R_2$, $R_3$, $R_4$, and $R_5$, which are the same or different, each represent a hydrogen atom, a nitro group, a halogen atom, a substituted or unsubstituted alkyl group, a substituted or unsubstituted alkoxy group, a substituted or unsubstituted alkoxycarbonyl group, a substituted or unsubstituted aryl group or a substituted or unsubstituted acylamino group; at least two of $R_1$, $R_2$, $R_3$, $R_4$, and $R_5$ may be taken together to form a cyclic structure; $R_6$ and $R_7$, which are the same or different, each represent a hydrogen atom, a cyano group, a substituted or unsubstituted alkyl group or a substituted or unsubstituted aryl group; $Y_1$ and $Y_2$, which are the same or different, each represent a substituted or unsubstituted alkyl group which may contain an ether linkage or a sulfide linkage or a substituted or unsubstituted alkenyl group provided that, when $Y_1$ and $Y_2$ each represent an alkyl group, (i) at least one of them is an alkyl group having a hydroxyl group, an ether linkage or a sulfide linkage or (ii) $Y_1$ and $Y_2$ each represent an alkyl group having two or more carbon atoms; at least one of $R_1$, $R_2$, $R_3$, $R_4$, and $R_5$ and at least one of $Y_1$ and $Y_2$ may be taken together to form a ring; at least one of $R_1$, $R_2$, $R_3$, $R_4$, and $R_5$ and at least one of $R_6$ and $R_7$ may be taken together to form a ring; and the acid generator may consist of two or more structures represented by formula (I) linked up together at any one of $R_1$, $R_2$, $R_3$, $R_4$, $R_5$, $R_6$, and $R_7$ or any one of $Y_1$ and $Y_2$ via a linking group; and $X^-$ represents a non-nucleophilic anion.

(2) The positive resist composition according to (1), wherein the polymer (A) comprises a repeating unit represented by formula (1):

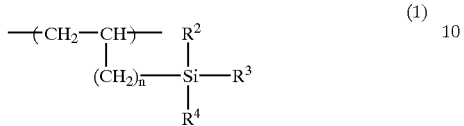

(1)

wherein $R^2$, $R^3$, and $R^4$ each represent an alkyl group, a haloalkyl group, a halogen atom, an alkoxy group, a trialkylsilyl group or a trialkylsilyloxy group; and n represents 0 or 1, and at least one of a repeating unit represented by formula (2a):

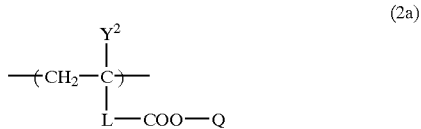

(2a)

wherein $Y^2$ represents a hydrogen atom, an alkyl group, a cyano group or a halogen atom; L represents a single bond or a divalent linking group; and Q represents a group capable of generating a carboxylic acid on decomposing by the action of an acid, and a repeating unit represented by formula (2b):

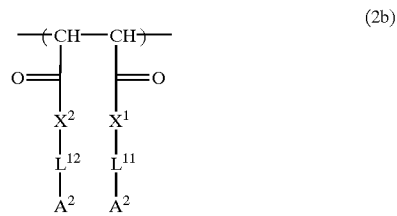

(2b)

wherein $X^1$ and $X^2$ each represent an oxygen atom, a sulfur atom, —NH— or —$NHSO_2$—; $L^{11}$ and $L^{12}$ each represent a single bond or a divalent linking group; two $A^2$'s each represent a hydrogen atom, a cyano group, a hydroxyl group, —COOH, —$COOR^5$, —CO—NH—$R^6$, a substituted or unsubstituted alkyl group, an alkoxy group or —COOQ; $R^5$ and $R^6$ each represent a substituted or unsubstituted alkyl group; and Q represents a group capable of generating a carboxylic acid on decomposing by the action of an acid.

(3) The positive resist composition according to (1), wherein the polymer (A) comprises a repeating unit represented by formula (1), at least one of repeating units represented by formulae (2a) and (2b), and a repeating unit represented by formula (3):

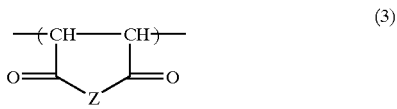

(3)

wherein Z represents —O— or —N($R^7$)—; $R^7$ represents a hydrogen atom, a hydroxyl group, an alkyl group, a haloalkyl group or —OSO—$R^8$; and $R^8$ represents an alkyl group, a haloalkyl group, a cycloalkyl group or a camphor residue.

(4) The positive resist composition according to (1), wherein the polymer (A) comprises a repeating unit represented by formula (4):

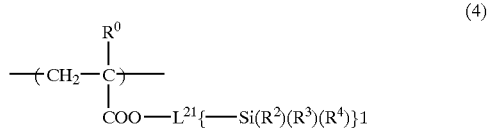

(4)

wherein $R^0$ represents a hydrogen atom, an alkyl group, a cyano group or a halogen atom; $L^{21}$ represents a divalent, trivalent or tetravalent linking group; $R^2$, $R^3$, and $R^4$ each represent an alkyl group, a haloalkyl group, a halogen atom, an alkoxy group, a trialkylsilyl group or a trialkylsilyloxy group; and 1 represents an integer of 1 to 3.

(5) The positive resist composition according to any one of (1) to (4), wherein the composition further comprises (C) an organic basic compound as an acid scavenger.

DETAILED DESCRIPTION OF THE INVENTION

The acid-degradable silicon-containing polymer as component (A) (hereinafter simply referred to as polymer (A)) includes (A1) a copolymer comprising a repeating unit of formula (1) and at least one of repeating units of formulae (2a) and (2b), (A2) a copolymer comprising a repeating unit of formula (1), at least one of repeating units of formulae (2a) and (2b), and a repeating unit of formula (3), (A3) a homopolymer consisting of a repeating unit of formula (4), and (A4) a copolymer comprising a repeating unit of formula (4) and other monomer unit.

In formula (1), $R^2$, $R^3$, and $R^4$ each represent an alkyl group, a haloalkyl group, a halogen atom, an alkoxy group, a trialkylsilyl group or a trialkylsilyloxy group.

The alkyl group is preferably a straight-chain or branched alkyl group having 1 to 10 carbon atoms, still preferably a straight-chain or branched alkyl group having 1 to 6 carbon atoms, particularly preferably methyl, ethyl, n-propyl, isopropyl, n-butyl, isobutyl, sec-butyl or t-butyl.

The haloalkyl group includes chloromethyl, bromomethyl, and iodomethyl.

The alkoxy group is preferably a straight-chain or branched alkoxy group having 1 to 6 carbon atoms, still preferably methoxy, ethoxy, n-propoxy, isopropoxy, n-butoxy, isobutoxy, sec-butoxy or t-butoxy, particularly preferably methoxy or ethoxy.

The alkyl moiety of the trialkylsilyl group is preferably a straight-chain or branched one having 1 to 6 carbon atoms, still preferably methyl, ethyl, n-propyl, isopropyl, n-butyl, isobutyl, sec-butyl or t-butyl, particularly preferably methyl.

The alkyl moiety of the trialkylsilyloxy group is preferably a straight-chain or branched one having 1 to 6 carbon atoms, still preferably methyl, ethyl, n-propyl, isopropyl, n-butyl, isobutyl, sec-butyl or t-butyl, particularly preferably methyl.

n represents 0 or 1.

The repeating unit represented by formula (1) includes, but is not limited to, the following examples.

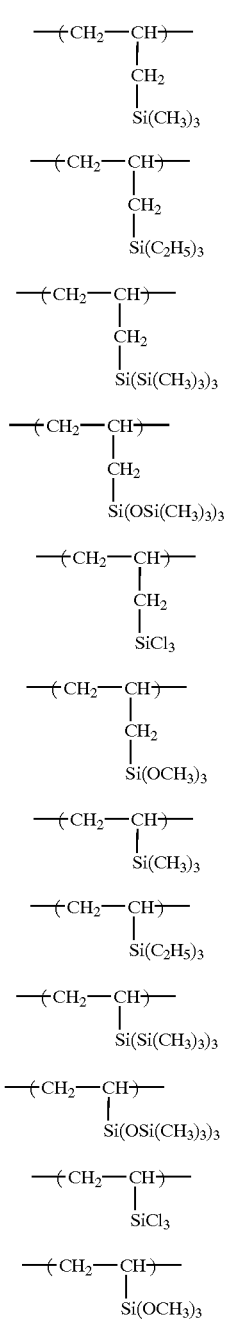

In formula (2a), $Y^2$ preferably represents a hydrogen atom, an alkyl group having 1 to 3 carbon atoms, a cyano group or a halogen atom (e.g., Cl, Br or I), still preferably a hydrogen atom or an alkyl group having 1 to 3 carbon atoms, particularly preferably a hydrogen atom or a methyl group.

L represents a single bond or a divalent linking group. Q represents a group capable of generating a carboxylic acid on decomposing by the action of an acid. Examples of Q include tertiary alkyl groups, e.g., t-butyl and t-amyl, an isobornyl group, 1-alkoxyethyl groups, e.g., 1-ethoxyethyl, 1-butoxyethyl, 1-isobutoxyethyl, and 1-cyclohexyloxyethyl, alkoxymethyl groups, e.g., 1-methoxymethyl and 1-ethoxymethyl, tetrahydropyranyl, tetrahydrofurfuryl, trialkylsilyl, 3-oxocyclohexyl, 2-methyladamantyl, mevaloniclactone residue, and 2-(γ-butyrolactonyloxycarbonyl)-2-propyl.

The repeating unit represented by formula (2a) includes, but is not limited to, the following.

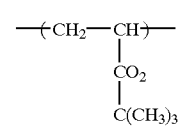

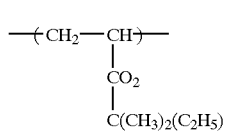

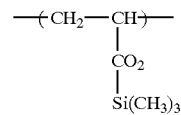

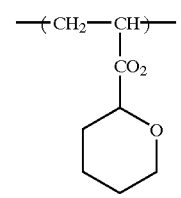

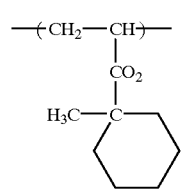

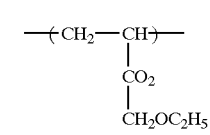

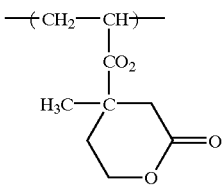

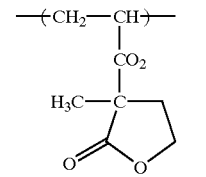

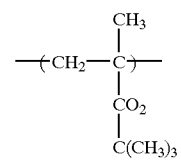

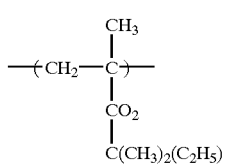
(2a-10)

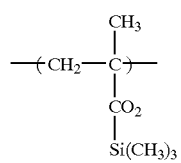
(2a-11)

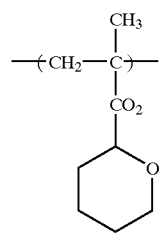
(2a-12)

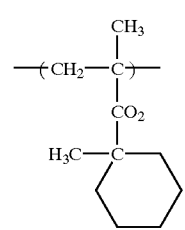
(2a-13)

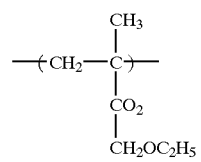
(2a-14)

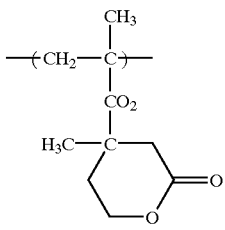
(2a-15)

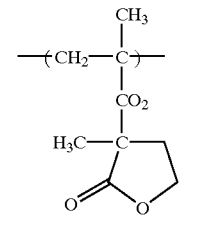
(2a-16)

In formula (2b), $X^1$ and $X^2$ each represent an oxygen atom, a sulfur atom, —NH— or —NHSO$_2$—, and $L^{11}$ and $L^{12}$ each represent a single bond or a divalent linking group.

The divalent linking group as $L^{11}$ or $L^{12}$ includes a substituted or unsubstituted alkylene group, an ether linkage, a thioether linkage, a carbonyl group, an ester linkage, an amido group, a sulfonamido group, a urethane group, a urea group, and a combination of two or more thereof.

The substituted or unsubstituted alkylene group as $L^{11}$ or $L^{12}$ includes one represented by —[C(R$_a$)(R$_b$)]$_r$—, wherein R$_a$ and R$_b$, which may be the same or different, each represent a hydrogen atom, a substituted or unsubstituted alkyl group, a halogen atom, a hydroxyl group or an alkoxy group, and r presents an integer of 1 to 10. The alkyl group is preferably a lower one, such as methyl, ethyl, propyl, isopropyl or butyl, still preferably methyl, ethyl, propyl or isopropyl. The substituent the alkyl group can have includes a hydroxyl group, a halogen atom, and an alkoxy group. The alkoxy group includes one having 1 to 4 carbon atoms, such as methoxy, ethoxy, propoxy or butoxy. The halogen atom includes chlorine, bromine, fluorine, and iodine.

In formula (2b), two $A^2$'s independently represent a hydrogen atom, a cyano group, a hydroxyl group, —COOH, —COOR$^5$, —CO—NH—R$^6$, a substituted or unsubstituted alkyl group, an alkoxy group or —COOQ, wherein R$^5$ and R$^6$ each represent a substituted or unsubstituted alkyl group.

The alkyl group as $A^2$, $R^5$ or $R^6$ is preferably a straight-chain or branched alkyl group having 1 to 10 carbon atoms, still preferably a straight-chain or branched one having 1 to 6 carbon atoms, particularly preferably methyl, ethyl, n-propyl, isopropyl, n-butyl, isobutyl, sect-butyl or t-butyl. The alkoxy group as $A^2$, $R^5$ or $R^6$ is preferably a straight-chain or branched one having 1 to 6 carbon atoms, still preferably methoxy, ethoxy, n-propoxy, isopropoxy, n-butoxy, isobutoxy, sec-butoxy or t-butoxy, particularly preferably methoxy or ethoxy.

Q represents a group capable of generating a carboxylic acid on decomposition. The same examples of Q recited as for the formula (2a) apply to Q of formula (2b).

The repeating unit represented by formula (2b) includes, but is not limited to, the following.

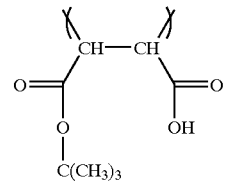
[2b-1]

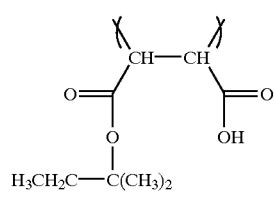
[2b-2]

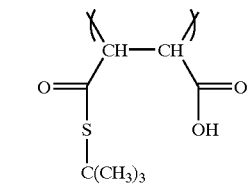
[2b-3]

[2b-4] 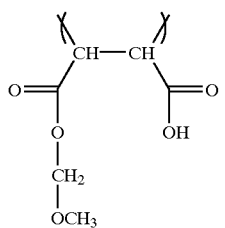
[2b-5] 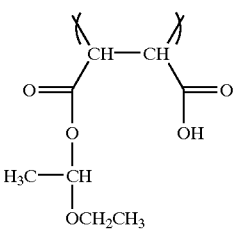
[2b-6] 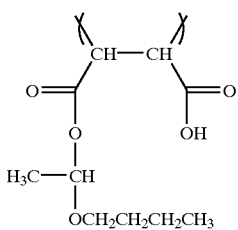
[2b-7] 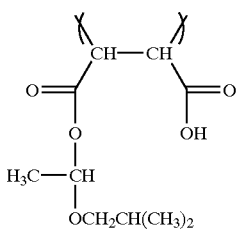
[2b-8] 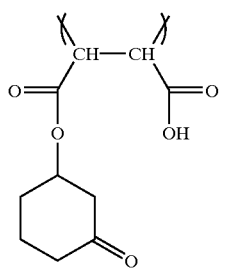
[2b-9] 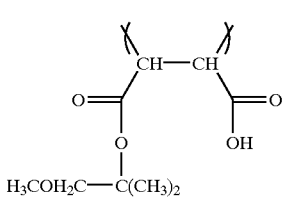
[2b-10] 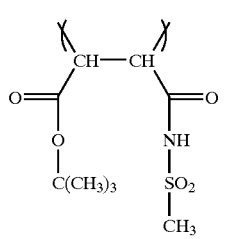
[2b-11] 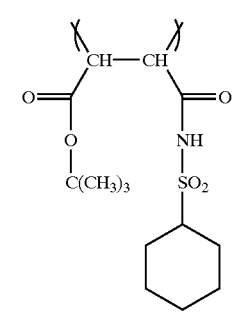
[2b-12] 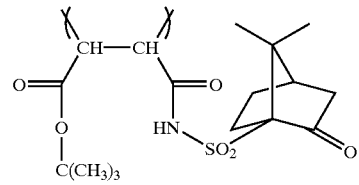
[2b-13] 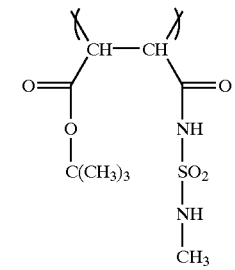
[2b-14] 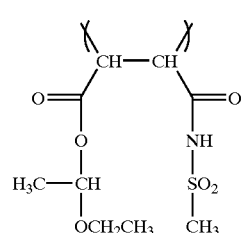
[2b-15] 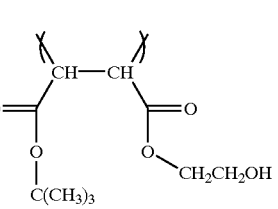
[2b-16] 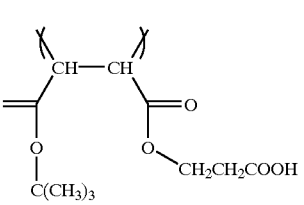
[2b-17] 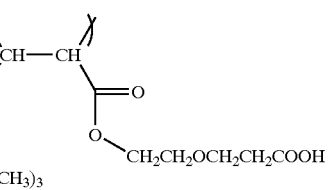

[2b-18]
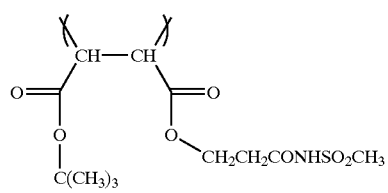
[2b-19]
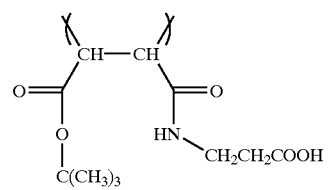
[2b-20]
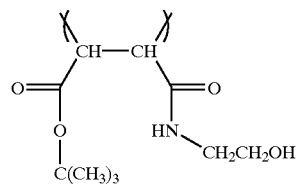
[2b-21]
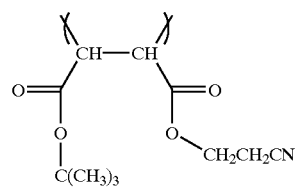
[2b-22]
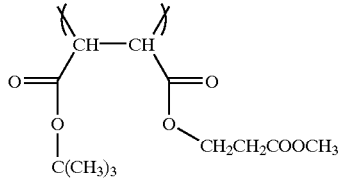
[2b-23]
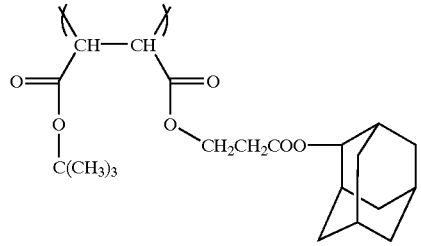
[2b-24]
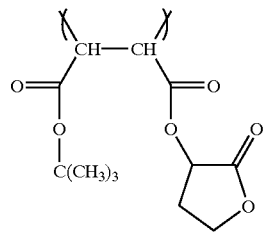
[2b-25]
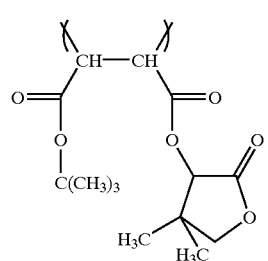
[2b-26]
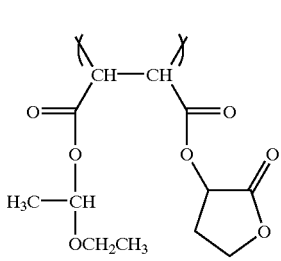
[2b-27]
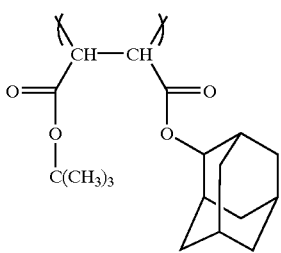
[2b-28]
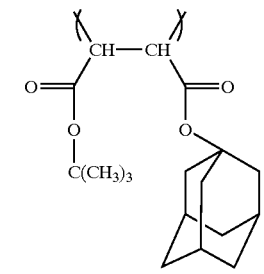
[2b-29]
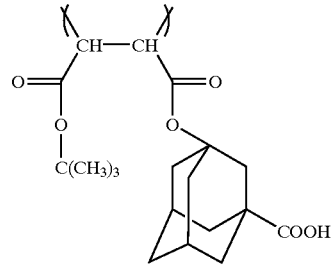
[2b-30]
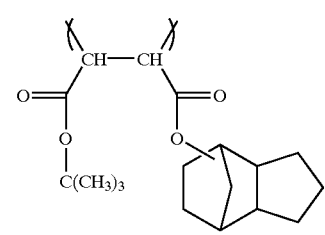

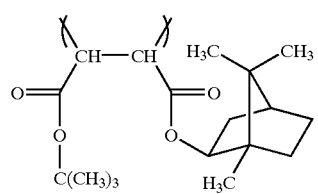 [2b-31]
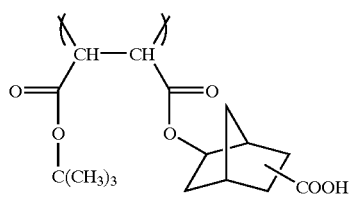 [2b-32]
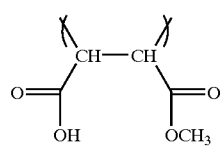 [2b-33]
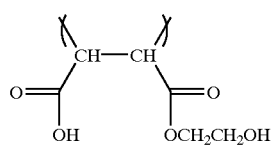 [2b-34]
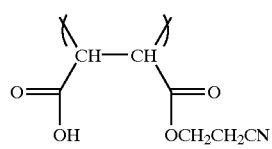 [2b-35]
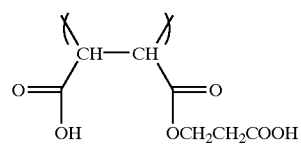 [2b-36]
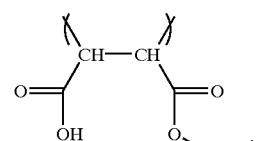 [2b-37]
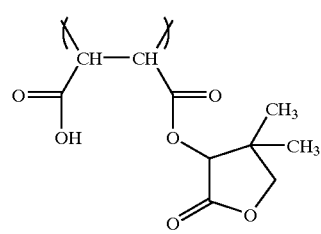 [2b-38]
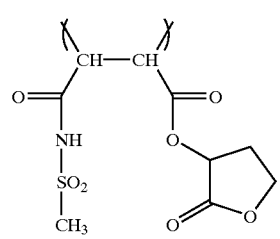 [2b-39]
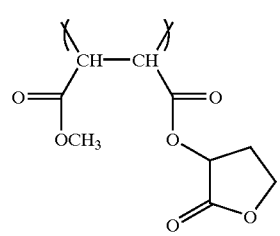 [2b-40]
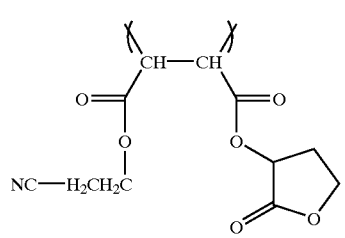 [2b-41]
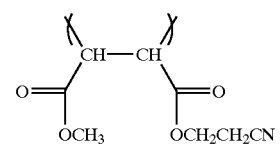 [2b-42]
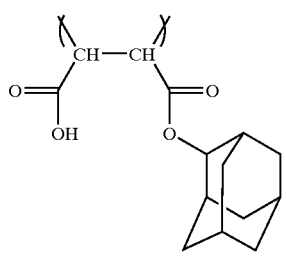 [2b-43]
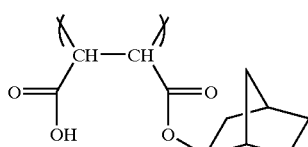 [2b-44]
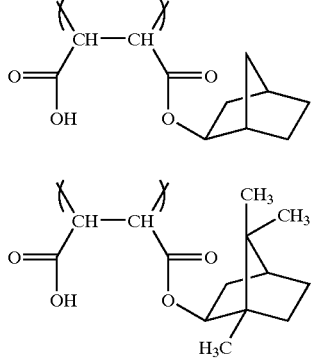 [2b-45]

[2b-46]
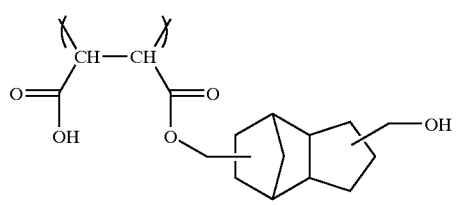
[2b-47]
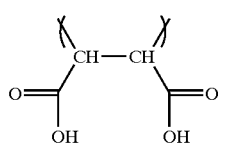
[2b-48]
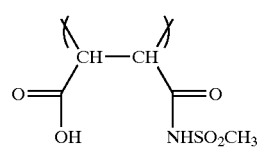
[2b-49]
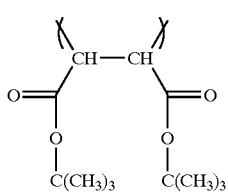
[2b-50]
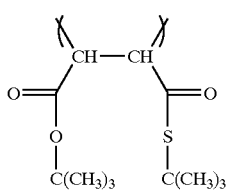
[2b-51]
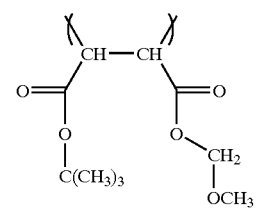
[2b-52]
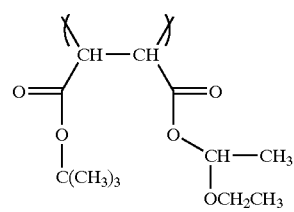
[2b-53]
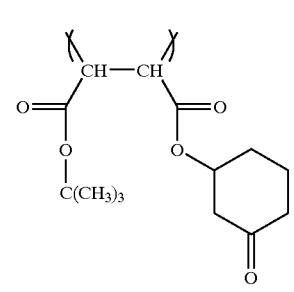
[2b-54]
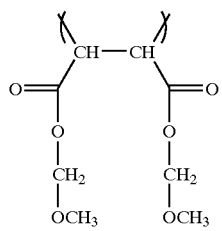
[2b-55]
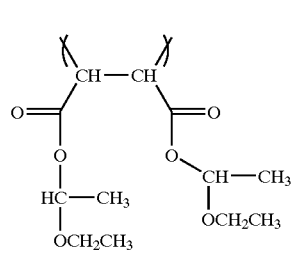
[2b-56]
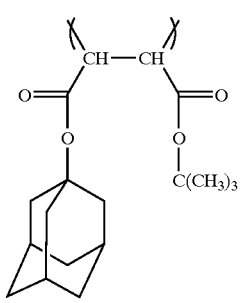
[2b-57]
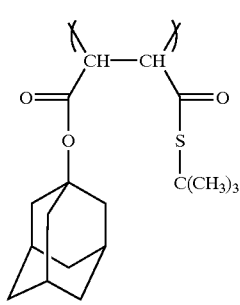
[2b-58]
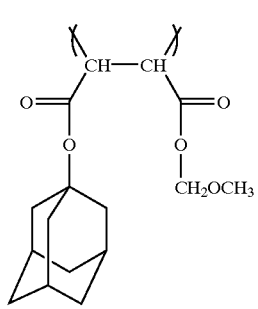

[2b-59]
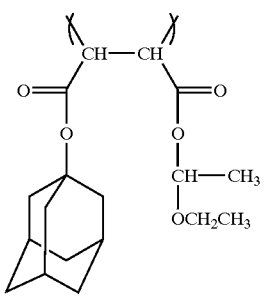

[2b-60]
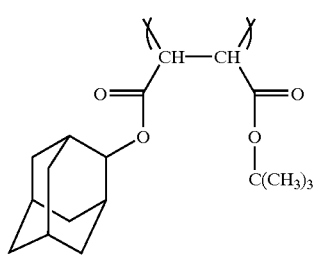

[2b-61]
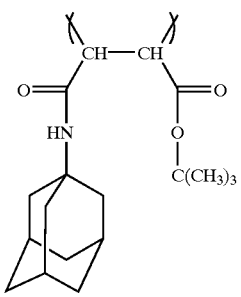

[2b-62]
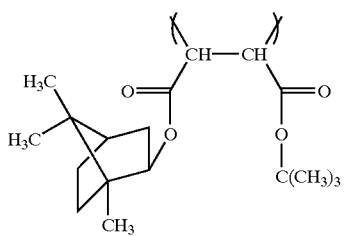

[2b-63]
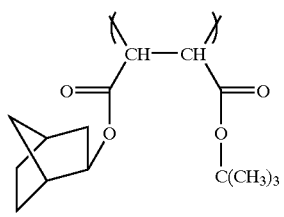

[2b-64]
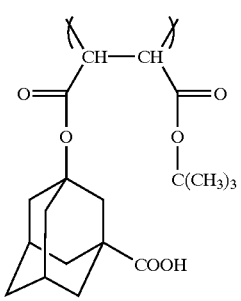

[2b-65]
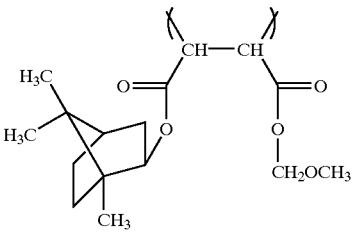

In formula (3), Z represents —O— or —N(R$^7$)—, wherein R$^7$ represents a hydrogen atom, a hydroxyl group, an alkyl group, a haloalkyl group or —OSO$_2$—R$^8$, and R$^8$ represents an alkyl group, a haloalkyl group, a cycloalkyl group or a camphor residue.

The alkyl group as R$^7$ or R$^8$ is preferably a straight-chain or branched one having 1 to 10 carbon atoms, still preferably a straight-chain or branched one having 1 to 6 carbon atoms, particularly preferably methyl, ethyl, propyl, isopropyl, n-butyl, isobutyl, sec-butyl or t-butyl.

The haloalkyl group as R$^7$ or R$^8$ includes trifluoromethyl, nanofluorobutyl, pentadecafluorooctyl, and trichloromethyl. The cycloalkyl group as R$^8$ includes cyclopentyl, cyclohexyl, and cyclooctyl.

The alkyl group or haloalkyl group as R$^7$ or R$^8$ and the cycloalkyl group or camphor residue as R$^8$ can have a substituent. Suitable substituents include a hydroxyl group, a carboxyl group, a cyano group, a halogen atom (e.g., Cl, Br, F or I), an alkoxy group (preferably one containing 1 to 4 carbon atoms, such as methoxy, ethoxy, propoxy or butoxy), an acyl group (preferably one having 2 to 5 carbon atoms, such as formyl or acetyl), an acyloxy group (preferably one having 2 to 5 carbon atoms, such as acetoxy), and an aryl group (preferably one having 6 to 14 carbon atoms, such as phenyl).

The repeating unit represented by formula (3) includes, but is not limited to, the following.

[3-1]
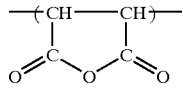

[3-2]
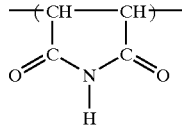

[3-3]
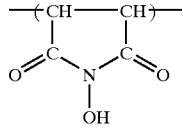

[3-4]
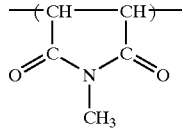

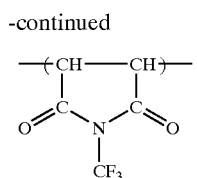
[3-5]

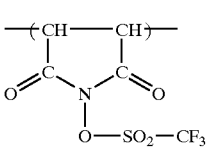
[3-6]

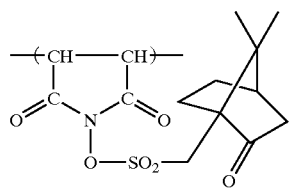
[3-7]

The contents of the repeating unit of formula (1) and the at least one of the repeating units of formulae (2a) and (2b) in the copolymer (A1) are decided with due consideration for resist performance properties, such as oxygen plasma etching resistance, contact adhesion to a substrate, sensitivity, profile, and resolution.

The content of the repeating unit of formula (1) is usually 10 to 90 mol %, preferably 15 to 70 mol %, still preferably 20 to 50 mol %. The content of the repeating unit of formula (2a) and/or the repeating unit of formula (2b) is usually 10 to 90 mol %, preferably 25 to 50 mol %.

The contents of the repeating unit of formula (1), the repeating unit of formula (2a) and/or the repeating unit of formula (2b), and the repeating unit of formula (3) in the copolymer (A2) are decided with due consideration for the resist performance properties.

The content of the repeating unit of formula (1) is usually 10 to 90 mol %, preferably 15 to 70 mol %, still preferably 20 to 50 mol %. The content of the repeating unit of formula (2a) and/or the repeating unit of formula (2b) is usually 5 to 50 mol %, preferably 10 to 40 mol %. The content of the repeating unit of formula (3) is usually 10 to 90 mol %, preferably 15 to 70 mol %, still preferably 20 to 60 mol %.

In formula (4), $R^0$ has the same meaning as $Y^2$ in formula (2a), and $R^2$, $R^3$, and $R^4$ have the same meaning as those in formula (1).

$L^{21}$ represents a divalent, trivalent or tetravalent linking group. $L^{21}$ includes a substituted or unsubstituted alkylene group, a cycloalkylene group, an arylene (e.g., phenylene) group, an aralkylene group, and a combination thereof. These linking groups can contain an —O— structure, a —COO— structure or an —O(CO)— structure in the middle but not at the terminals. The substituent includes a halogen atom (e.g., Cl or Br), a cyano group, a hydroxyl group, an amino group, an alkyl group having 1 to 4 carbon atoms, a cycloalkyl group having 3 to 8 carbon atoms, an alkoxy group having 1 to 4 carbon atoms, an aryl group having 6 to 12 carbon atoms, and an aralkyl group having 7 to 14 carbon atoms.

The divalent linking group as $L^{21}$ is preferably a substituted or unsubstituted alkylene group having 1 to 8 carbon atoms, a phenylene group or a combination thereof, still preferably an alkylene group having 1 to 6 carbon atoms (e.g., methylene, ethylene, propylene, butylene, —C(CH$_3$)$_2$—CH$_2$— or C(CH$_3$)$_2$—CH$_2$CH$_2$—.

The trivalent linking group as $L^{21}$ is preferably a substituted or unsubstituted alkanetriyl group having 1 to 10 carbon atoms, a benzenetriyl group or a combination thereof. The following trivalent groups are still preferred.

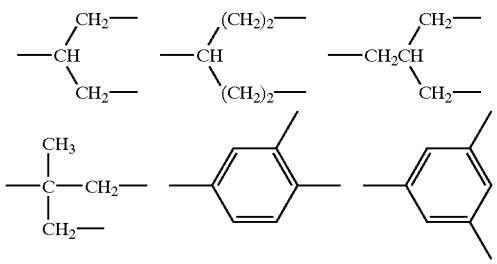

The tetravalent linking group as $L^{21}$ is preferably a substituted or unsubstituted alkanetetrayl group having 1 to 10 carbon atoms, a benzenetetrayl group or a combination thereof. The following tetravalent groups are still preferred.

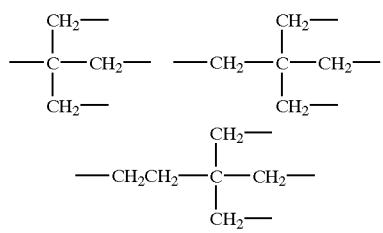

l represents an integer of 1 to 3.

The repeating unit represented by formula (4) which has the silicon atom bonded to the β-position of the ester group with respect to the ether oxygen serves as an acid-degradable group by itself. Such a repeating unit provides an acid-degradable polymer (A) either alone or in combination with other acid-degradable group-containing monomer unit.

The repeating unit represented by formula (4) which has the silicon atom bonded to a position other than the β-position of the ester group with respect to the ether oxygen is copolymerized with other monomer unit containing an acid-degradable group to provide an acid-degradable polymer (A4). Copolymerizable monomer units containing an acid-degradable group include those represented by formulae (2a) and (2b).

The repeating unit of formula (4) includes, but is not limited to the following.

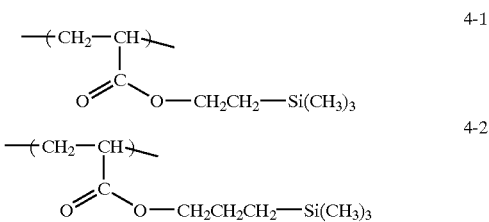

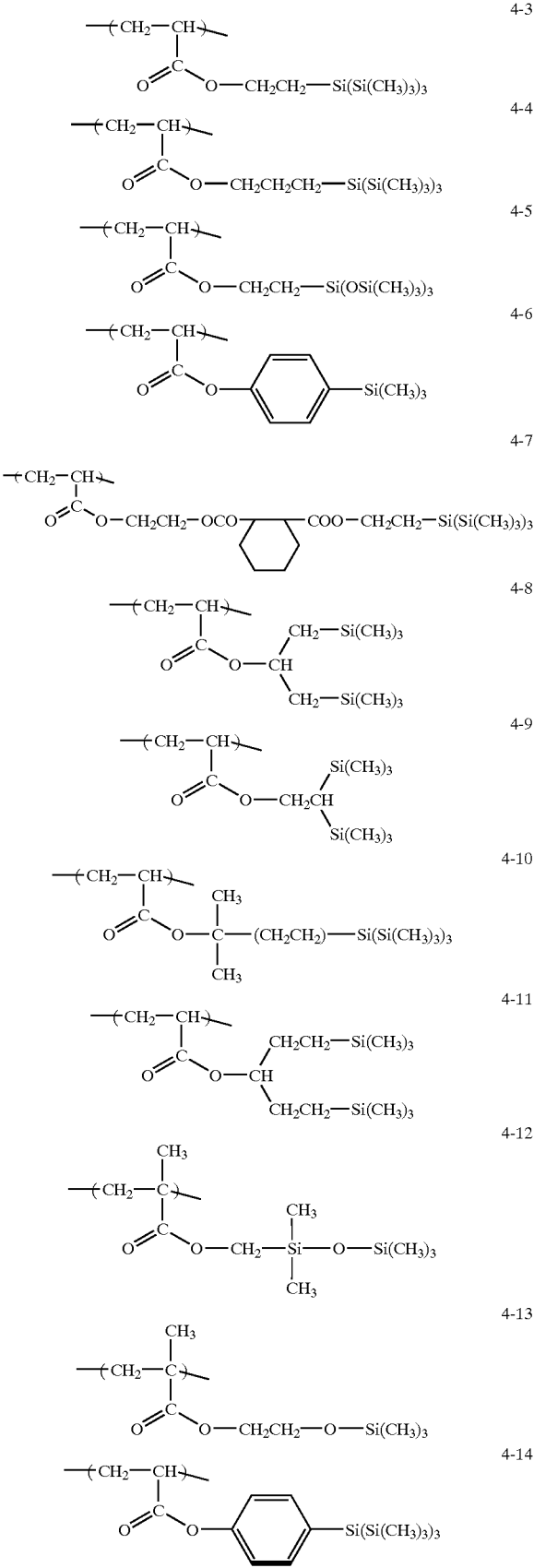

Where the repeating unit of formula (4) functions as an acid-degradable group, its content in the polymer (A3) or (A4) is decided with due consideration for resist performance properties, such as oxygen plasma etching resistance, contact adhesion to a substrate, sensitivity, profile, and resolution. It is preferably 10 to 100 mol %, still preferably 20 to 90 mol % particularly preferably 25 to 80 mol %.

Where the repeating unit of formula (4) does not function as an acid-degradable group, its content in the polymer (A4) is appropriately decided similarly. It is preferably 10 to 90 mol %, still preferably 15 to 70 mol %, particularly preferably 20 to 50 mol %. The content of the other repeating unit(s) of formulae (2a) and/or (2b) is preferably 10 to 90 mol %, still preferably 25 to 50 mol %.

The polymer (A) may comprise repeating units other than those of formulae (1), (2a), (2b), (3), and (4) for the purpose of improving film-forming properties, contact adhesion, and developability. Useful comonomers providing the other repeating units include compounds having one addition polymerizable unsaturated bond, such as acrylic esters, methacrylic esters, acrylamides, methacrylamides, allyl compounds, vinyl ethers, and vinyl esters.

The acrylic esters include alkyl esters, preferably those having 1 to 10 carbon atoms in the alkyl moiety. Examples are methyl acrylate, ethyl acrylate, propyl acrylate, amyl acrylate, cyclohexyl acrylate, ethylhexyl acrylate, octyl acrylate, t-octyl acrylate, chloroethyl acrylate, trimethylolpropane monoacrylate, pentaerythritol monoacrylate, benzyl acrylate, methoxybenzyl acrylate, furfuryl acrylate, and tetrahydrofurfuryl acrylate.

The methacrylic esters include alkyl esters, preferably those having 1 to 10 carbon atoms in the alkyl moiety. Examples are methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, trimethylolpropane monomethacrylate, pentaerythritol monomethacrylate, furfuryl methacrylate, and tetrahydrofurfuryl methacrylate.

The acrylamides include acrylamide, N-alkylacrylamides having an alkyl moiety containing 1 to 10 carbon atoms (e.g., methyl, ethyl, propyl, butyl, t-butyl, heptyl, octyl, cyclohexyl or hydroxyethyl), N,N-dialkylacrylamides having an alkyl group containing 1 to 10 carbon atoms (e.g., methyl, ethyl, butyl, isobutyl, ethylhexyl or cyclohexyl), N-hydroxyethyl-N-methylacrylamide, and N-2-acetamidoethyl-N-acetylacrylamide.

The methacrylamides include methacrylamide, N-alkylmethacrylamides having an alkyl moiety containing 1 to 10 carbon atoms (e.g., methyl, ethyl, t-butyl, ethylhexyl, hydroxyethyl or cyclohexyl), N,N-dialkylmethacrylamides having ethyl, propyl, butyl, etc. as an alkyl moiety, and N-hydroxyethyl-N-methylmethacrylamide.

The allyl compounds include allyl esters (e.g., allyl acetate, allyl capronate, allyl caprylate, allyl laurate, allyl palmitate, allyl stearate, allyl benzoate, allyl acetoacetate, and allyl lactate) and allyloxyethanol.

The vinyl ethers include alkyl vinyl ethers, such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether.

The vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexylcarboxylate.

Further included in the other copolymerizable monomers are dialkyl itaconates (e.g., dimethyl itaconate, diethyl itaconate, and dibutyl itaconate), dialkyl fumarates (e.g., dibutyl fumarate), monoalkyl fumarates, acrylic acid, methacrylic acid, crotonic acid, itaconic acid, maleicanhydride, maleimide, acrylonitrile, methacrylonitrile, and maleonitrile. Any other addition polymerizable unsaturated compounds that are copolymerizable with the repeating units of formulae (1), (2a), (2b), (3) and (4) can be used.

The average molecular weight of the polymer (A) is preferably, but not limited to, 1000 to 1,000,000, still preferably 2000 to 100,000, from the standpoint of compatibility with components (B) and/or (C) and other additives, solubility in organic solvents, film-forming properties, and the like.

The polymers (A) can be used either individually or as a mixture of two or more thereof as component (A). Component (A) is used in an amount preferably of from 40 to 99% by weight, preferably 60 to 98% by weight, based on the solids content (exclusive of a solvent) of the resist composition.

Specific but non-limiting examples of the polymer (A) are shown below. The subscripts attached to the closing parentheses in the following structural formulae indicate molar fractions.

Resin 1:

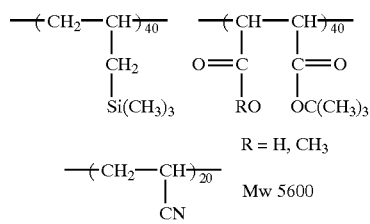

Resin 2:

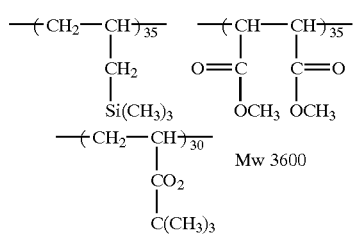

-continued

Resin 3:

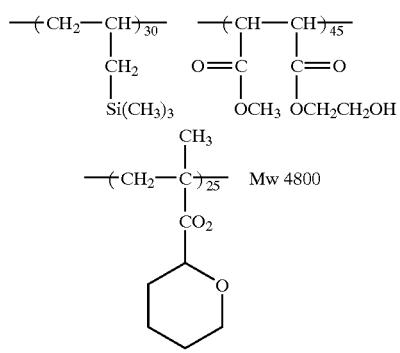

Resin 4:

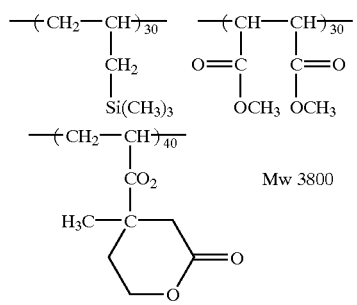

Resin 5:

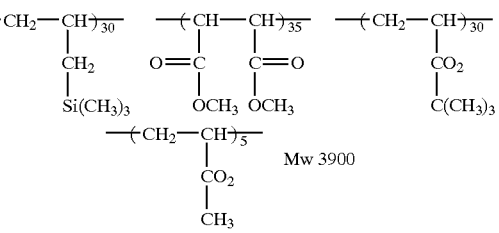

Resin 6:

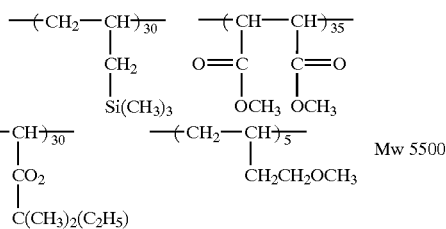

Resin 7:

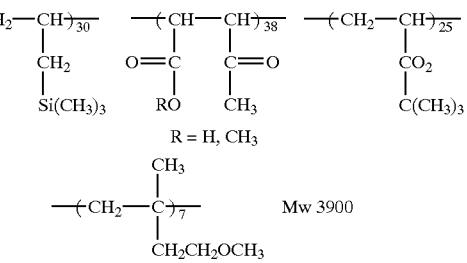

Resin 8:

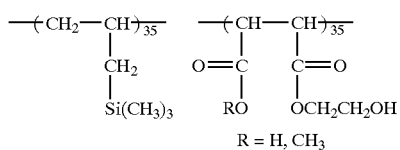

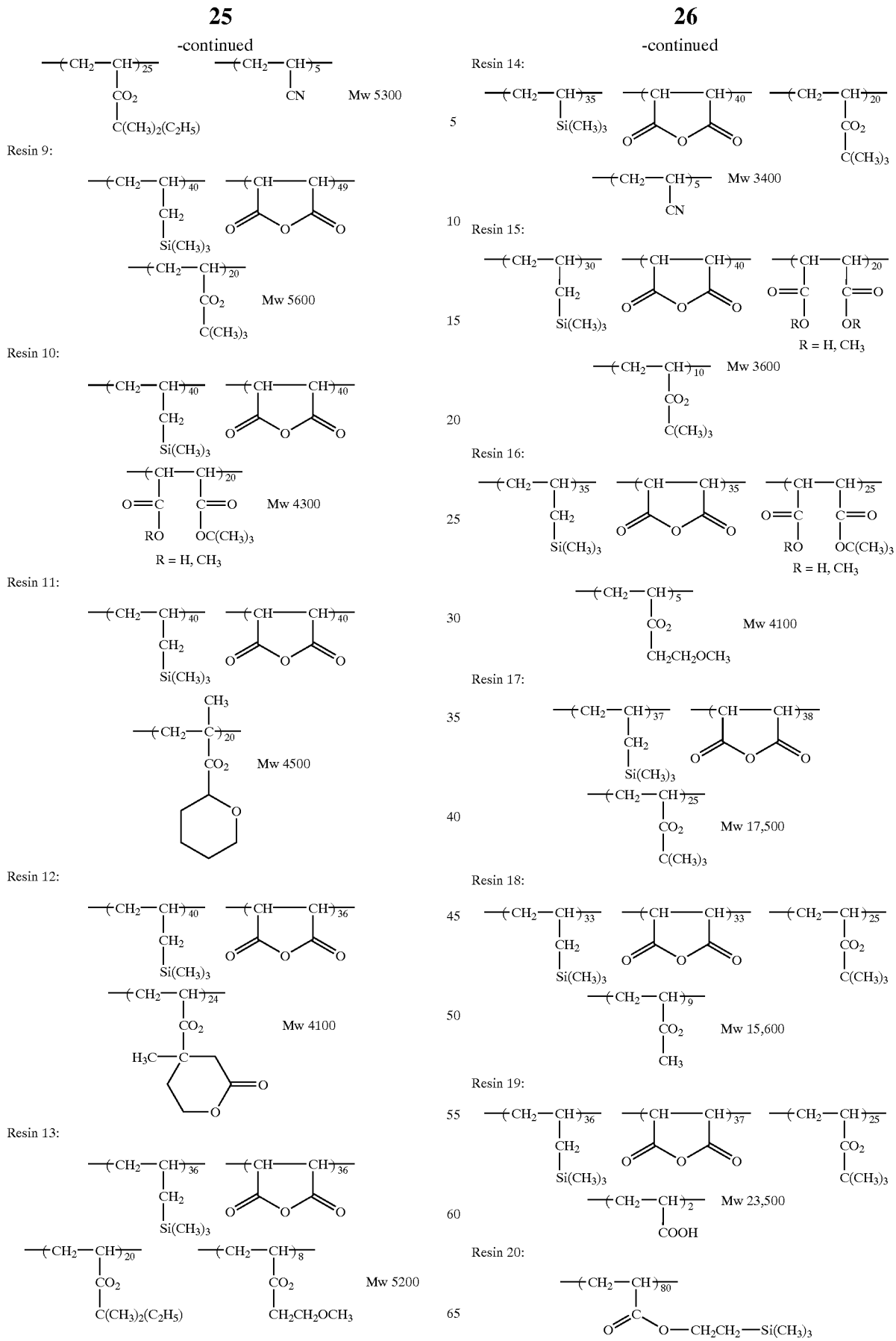

-continued
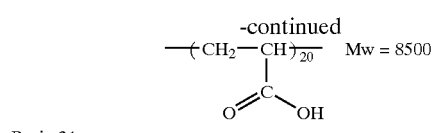
Mw = 8500
Resin 21:
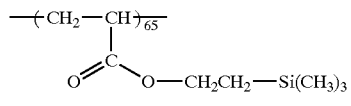 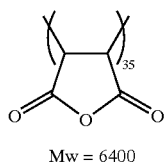
Mw = 6400
Resin 22:
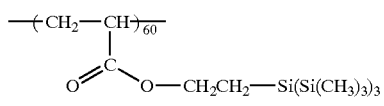 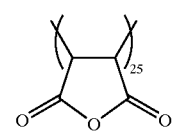
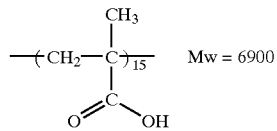
Mw = 6900
Resin 23:
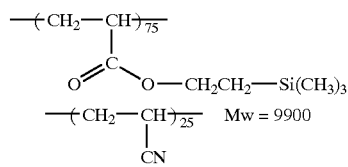
Mw = 9900
Resin 24:
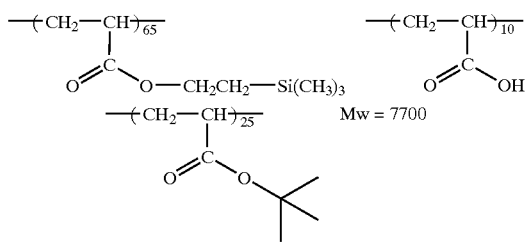
Mw = 7700
Resin 25:
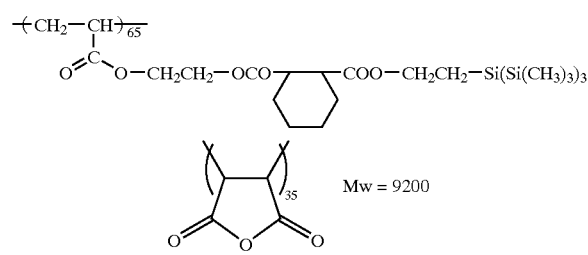
Mw = 9200
Resin 26:
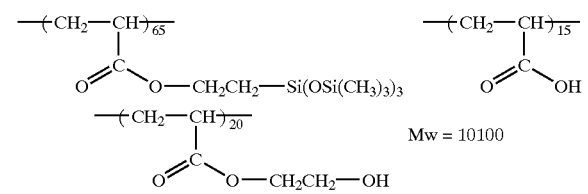 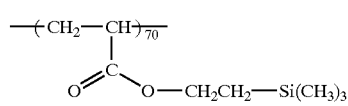
Mw = 10100
Resin 27:
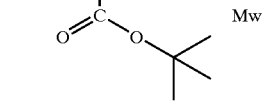
-continued
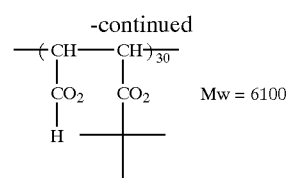
Mw = 6100
Resin 28:
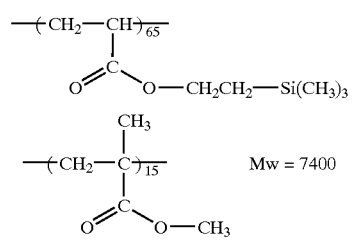
Mw = 7400
Resin 29:
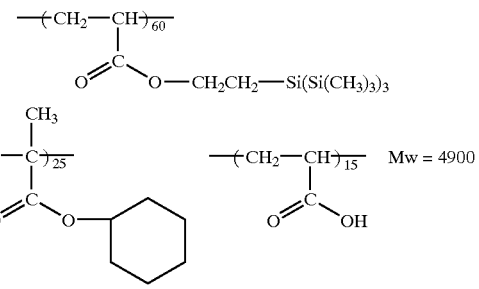
Mw = 4900
Resin 30:
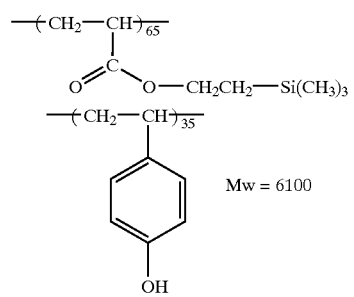
Mw = 6100
Resin 31:
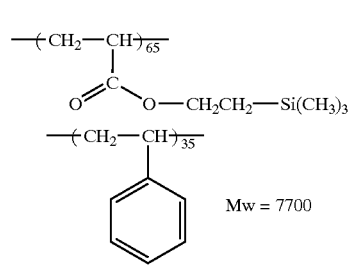
Mw = 7700
Resin 32:
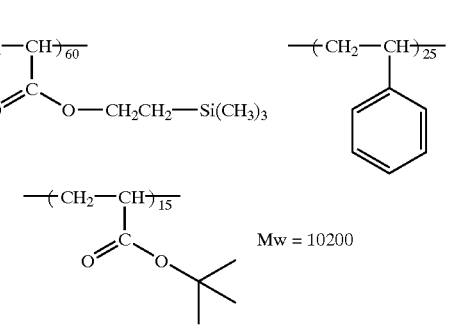
Mw = 10200

-continued

Resin 33:
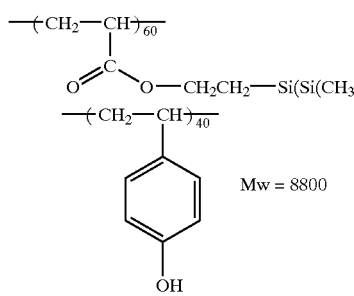

Resin 34:
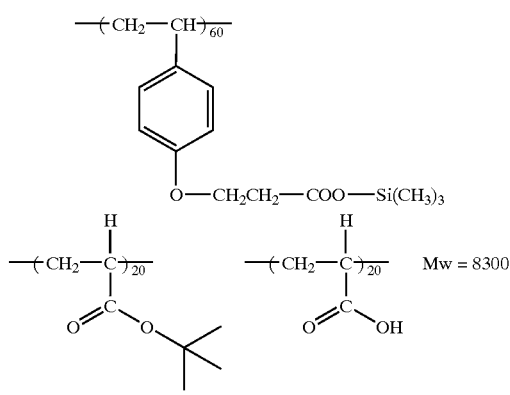

Resin 35:
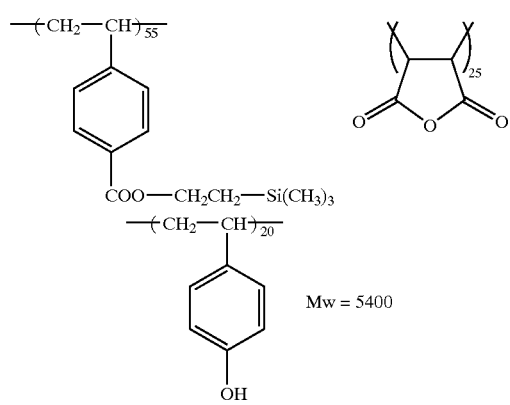

The acid generator which can be used in the invention as component (B) is a compound represented by formula (I), which generates an acid when exposed to active light or radiations.

In formula (I), $R_1$, $R_2$, $R_3$, $R_4$, and $R_5$, which are the same or different, each represent a hydrogen atom, a nitro group, a halogen atom, a substituted or unsubstituted alkyl group, a substituted or unsubstituted alkoxy group, a substituted or unsubstituted alkoxycarbonyl group, a substituted or unsubstituted aryl group or a substituted or unsubstituted acylamino group; at least two of $R_1$, $R_2$, $R_3$, $R_4$, and $R_5$ may be taken together to form a cyclic structure; $R_6$ and $R_7$, which are the same or different, each represent a hydrogen atom, a cyano group, a substituted or unsubstituted alkyl group or a substituted or unsubstituted aryl group; $Y_1$ and $Y_2$, which are the same or different, each represent a substituted or unsubstituted alkyl group which may contain an ether linkage or a sulfide linkage, or a substituted or unsubstituted alkenyl group provided that, when $Y_1$ and $Y_2$ each represent an alkyl group, (i) at least one of them is an alkyl group having a hydroxyl group, an ether linkage or a sulfide linkage or (ii) $Y_1$ and $Y_2$ each represent an alkyl group having 2 or more carbon atoms; at least one of $R_1$, $R_2$, $R_3$, $R_4$, and $R_5$ and at least one of $Y_1$ and $Y_2$ may be taken together to form a ring; at least one of $R_1$, $R_2$, $R_3$, $R_4$, and $R_5$ and at least one of $R_6$ and $R_7$ may be taken together to form a ring; and the acid generator may consist of two or more structures represented by formula (I) linked up together at any one of $R_1$, $R_2$, $R_3$, $R_4$, $R_5$, $R_6$, and $R_7$ or any one of $Y_1$ and $Y_2$ via a linking group; and $X^-$ represents a non-nucleophilic anion.

The alkyl group as $R_1$, $R_2$, $R_3$, $R_4$, $R_5$, $R_6$ or $R_7$ or the alkyl moiety of the acylamino group as $R_1$, $R_2$, $R_3$, $R_4$, $R_5$, $R_6$ or $R_7$ is preferably a straight-chain, branched or cyclic alkyl group having 1 to 10 carbon atoms, such as methyl, ethyl, propyl, n-butyl, sec-butyl, t-butyl, cyclobutyl, pentyl, neopentyl, cyclopentyl, hexyl, cyclohexyl, heptyl, octyl, nonyl or decyl.

The alkoxy group as $R_1$, $R_2$, $R_3$, $R_4$ or $R_5$ or the alkoxy moiety of the alkoxycarbonyl group as $R_1$, $R_2$, $R_3$, $R_4$ or $R_5$ is preferably an alkoxy group having 1 to 10 carbon atoms, such as methoxy, ethoxy, propoxy, butoxy, pentyloxy, hexyloxy, cyclohexyloxy, heptyloxy, octyloxy, nonyloxy or decyloxy.

The aryl group as $R_1$, $R_2$, $R_3$, $R_4$, $R_5$, $R_6$ or $R_7$ is preferably an aryl group having 6 to 14 carbon atoms, such as phenyl, tolyl or naphthyl.

The halogen atom as $R_1$, $R_2$, $R_3$, $R_4$ or $R_5$ includes fluorine, chlorine, bromine, and iodine.

The alkyl group as $Y_1$ or $Y_2$ is preferably a straight-chain, branched or cyclic alkyl group having 1 to 20 carbon atoms, such as methyl, ethyl, propyl, isopropyl, n-butyl, isobutyl, t-butyl, n-hexyl, cyclohexyl, octyl or dodecyl, still preferably a straight-chain, branched or cyclic alkyl group having 3 to 20 carbon atoms, such as propyl, isopropyl, n-butyl, isobutyl, t-butyl, n-hexyl, cyclohexyl, octyl or dodecyl, particularly preferably a straight-chain, branched or cyclic alkyl group having 4 to 12 carbon atoms, such as n-butyl, isobutyl, t-butyl, n-hexyl, cyclohexyl, octyl or dodecyl.

The alkenyl group as $Y_1$ or $Y_2$ is preferably an alkenyl group having 2 to 6 carbon atoms, such as vinyl, propenyl, butenyl or hexenyl.

At least two out of $R_1$, $R_2$, $R_3$, $R_4$, and $R_5$ may be taken together to form a cyclic structure. The group formed of at least two of $R_1$, $R_2$, $R_3$, $R_4$, and $R_5$ taken together is preferably an alkylene group having 4 to 10 carbon atoms, such as butylene, pentylene or hexylene.

The alkyl group, alkoxy group, alkoxycarbonyl group, aryl group, aralkyl group and alkenyl group may be substituted with a nitro group, a halogen atom, a carboxyl group, a hydroxyl group, an amino group, a cyano group, an alkoxy group (preferably one having 1 to 5 carbon atoms), an alkylthio group (preferably one having 1 to 5 carbon atoms), and the like. The aryl group and the aralkyl group may be substituted with an alkyl group (preferably one having 1 to 5 carbon atoms). A halogen atom is a preferred substituent for the alkyl group.

When $Y_1$ and $Y_2$ both represent an alkyl group, (i) at least one of them has a hydroxyl group, an ether linkage or a sulfide linkage or (ii) both of them represent an alkyl group having 2 or more carbon atoms.

Where each of $Y_1$ and $Y_2$ is an alkyl group with none of a substituent, an ether linkage, and a sulfide linkage, it is preferred for both $Y_1$ and $Y_2$ to have 3 or more carbon atoms, particularly 4 or more carbon atoms.

Compounds of formula (I) wherein $Y_1$ and $Y_2$ are taken together to form a cyclic structure are unfavorable because they cause pattern collapse.

The total number of the carbon atoms present in $R_1$, $R_2$, $R_3$, $R_4$, and $R_5$ is preferably 0 or 1. It is particularly preferred for all of $R_1$, $R_2$, $R_3$, $R_4$, and $R_5$ be a hydrogen atom.

The non-nucleophilic anion as $X^-$ includes a sulfonate anion, a carboxylate anion, a bis(alkylsulfonyl)imide anion, and tris(alkylsulfonyl)methyl anion. The term "non-nucleophilic anion" denotes an anion having little capability of inducing nucleophilic reaction but capability of preventing the compound from decomposing with time due to intramolecular nucleophilic reaction. The non-nucleophilic anion of the acid generator contributes to storage stability of the resist composition.

The sulfonate anion includes alkylsulfonate anions, arylsulfonate anions, and a camphorsulfonate anion. The carboxylate anion includes alkylcarboxylate anions, arylcarboxylate anions, and aralkylcarboxylate anions.

The alkyl moiety of the alkylsulfonate anions is preferably an alkyl group having 1 to 30 carbon atoms, such as methyl, ethyl, propyl, isopropyl n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl, or bornyl.

The aryl moiety of the arylsulfonate anions is preferably an aryl group having 6 to 14 carbon atoms, such as phenyl, tolyl or naphthyl.

The alkyl or aryl moiety in the alkylsulfonate anions or arylsulfonate anions may have a substituent selected from a halogen atom, an alkyl group, an alkoxy group, an alkylthio group, etc. The halogen atom includes chlorine, bromine, fluorine, and iodine. The alkyl group preferably includes an alkyl group having 1 to 15 carbon atoms, e.g., methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl or eicosyl. The alkoxy group preferably includes an alkoxy group having 1 to 5 carbon atoms, such as methoxy, ethoxy, propoxy or butoxy. The alkylthio group preferably includes the one having 1 to 15 carbon atoms, such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, hexadeptylthio, octadecylthio, nonadecylthio, or eicosylthio. The alkyl group, alkoxy group and alkylthio group may be substituted with a halogen atom (preferably fluorine).

Examples of the alkyl moiety of the alkylcarboxylate anions are the same as those recited above for the alkylsulfonate anions. Examples of the aryl moiety of the arylcarboxylate anions are the same as those recited above for the arylsulfonate anions.

The aralkyl moiety of the aralkylcarboxylate anions preferably includes an aralkyl group having 6 to 12 carbon atoms, such as benzyl, phenethyl, naphtylmethyl or naphthylethyl.

The alkyl, aryl or aralkyl moiety in the alkyl-, aryl- or aralkylcarboxylate anions may have a substituent selected from, for example, those recited above with respect to the arylsulfonate anions, such as a halogen atom, an alkyl group, an alkoxy group, and an alkylthio group.

The alkyl moiety in the bis (alkylsulfonyl) imide anions and tris(alkylsulfonyl)methyl anions is preferably an alkyl group having 1 to 5 carbon atoms, such as methyl, ethyl, propyl, isopropyl, n-butyl, isobutyl, sec-butyl, pentyl or neopentyl group. The alkyl group may have a substituent, such as a halogen atom, an alkoxy group or an alkylthio group.

A phosphorus fluoride anion, a boron fluoride anion, an antimony fluoride anion are also included in non-nucleophilic anions.

$X^-$ is preferably a 1-fluorinated sulfonate anion, still preferably a perfluoroalkanesulfonate anion. A benzenesulfonate anion substituted with a fluorine atom or a fluorine-containing substituent is also preferred.

In formula (I), at least one of $R_1$, $R_2$, $R_3$, $R_4$, and $R_5$ and at least one of $Y_1$ and $Y_2$ may be taken together to form a ring; or at least one of $R_1$, $R_2$, $R_3$, $R_4$, and $R_5$ and at least one of $R_6$ and $R_7$ may be taken together to form a ring. In these cases, the group formed of at least one of $R_1$, $R_2$, $R_3$, $R_4$, and $R_5$ and at least one of $Y_1$ and $Y_2$ and the group formed of at least one of $R_1$, $R_2$, $R_3$, $R_4$, and $R_5$ and at least one of $R_6$ and $R_7$ preferably include alkylene groups having 2 to 10 carbon atoms, such as ethylene, propylene, butylene, pentylene, and hexylene.

The compound of formula (I) which contains the above-described ring has a fixed steric structure to exhibit improved photo resolution.

The compound of formula (I) may have two or more structures of formula (I) linked up together at any one of $R_1$, $R_2$, $R_3$, $R_4$, $R_5$, $R_6$, and $R_7$ or any one of $Y_1$ and $Y_2$ via a linking group. The number of the structures of formula (I) linked together is preferably 2 to 4, still preferably 2.

The compound of formula (I) preferably includes, but is not limited to, the following examples.

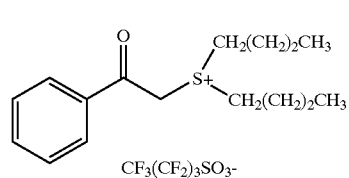

I-1

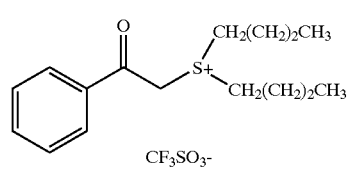

I-2

-continued
I-3
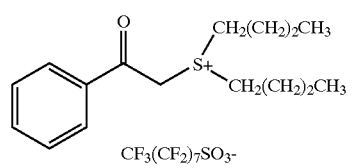
CF₃(CF₂)₇SO₃⁻
I-4
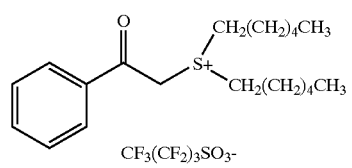
CF₃(CF₂)₃SO₃⁻
I-5
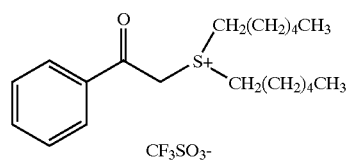
CF₃SO₃⁻
I-6
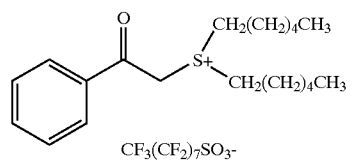
CF₃(CF₂)₇SO₃⁻
I-7
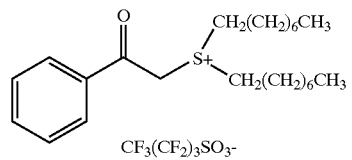
CF₃(CF₂)₃SO₃⁻
I-8
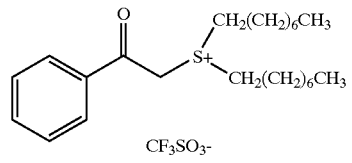
CF₃SO₃⁻
I-9
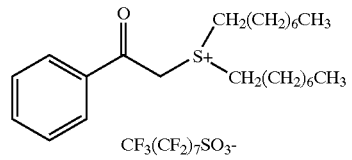
CF₃(CF₂)₇SO₃⁻
I-10
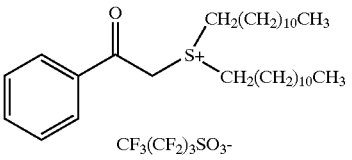
CF₃(CF₂)₃SO₃⁻
I-11
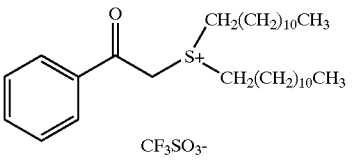
CF₃SO₃⁻
-continued
I-12
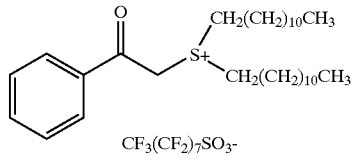
CF₃(CF₂)₇SO₃⁻
I-13
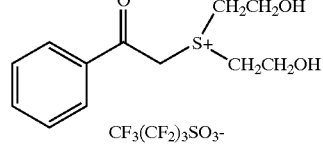
CF₃(CF₂)₃SO₃⁻
I-14
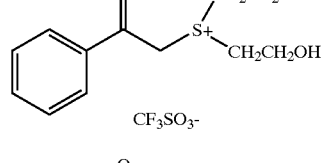
CF₃SO₃⁻
I-15
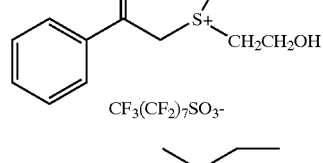
CF₃(CF₂)₇SO₃⁻
I-16
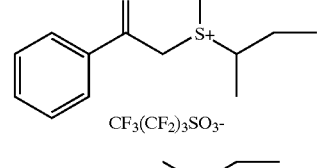
CF₃(CF₂)₃SO₃⁻
I-17
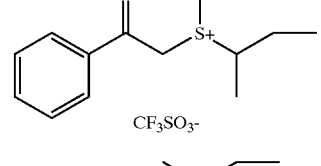
CF₃SO₃⁻
I-18
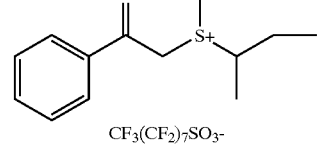
CF₃(CF₂)₇SO₃⁻
I-19
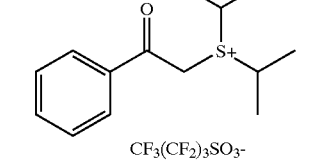
CF₃(CF₂)₃SO₃⁻
I-20
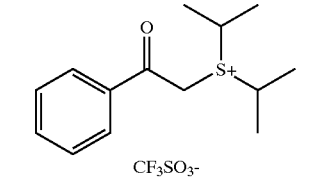
CF₃SO₃⁻

-continued

I-21 through I-36: sulfonium salt structures with various counter ions (CF₃(CF₂)₇SO₃⁻, CF₃(CF₂)₃SO₃⁻, CF₃SO₃⁻).

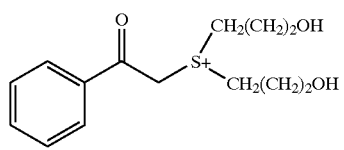
I-37
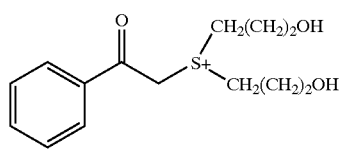
I-38
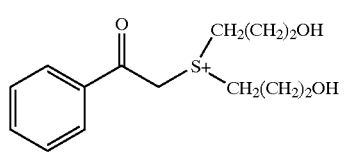
I-39
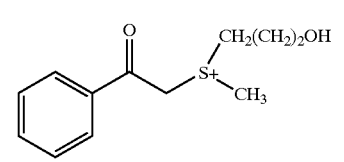
I-40
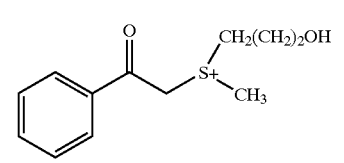
I-41
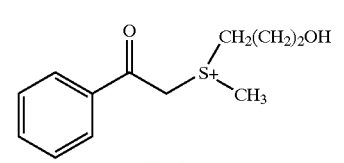
I-42
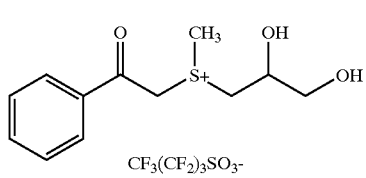
I-43
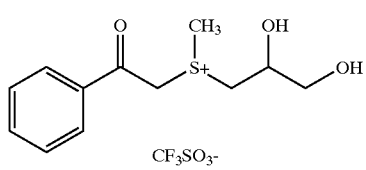
I-44
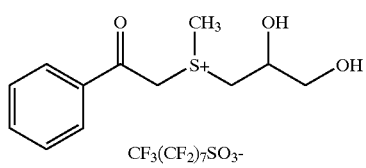
I-45
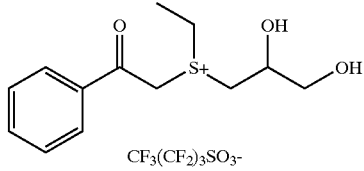
I-46
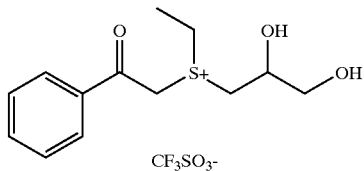
I-47
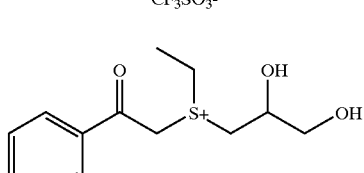
I-48
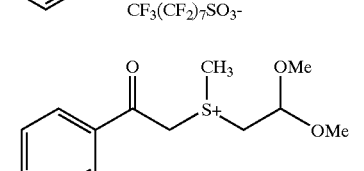
I-49
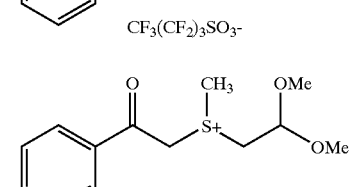
I-50
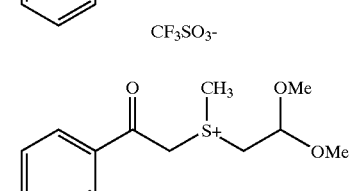
I-51
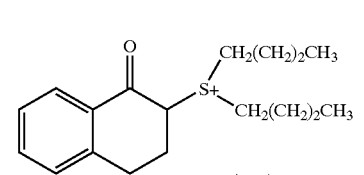
I-52
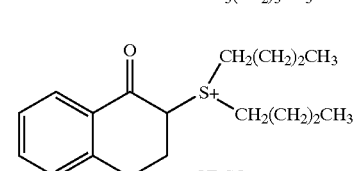
I-53
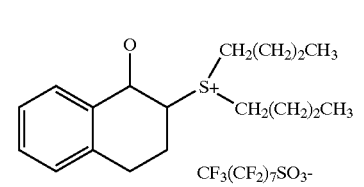
I-54

-continued
I-55
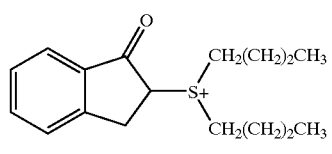
I-56
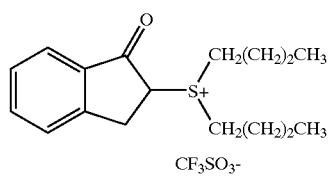
I-57
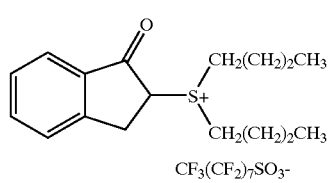
I-58
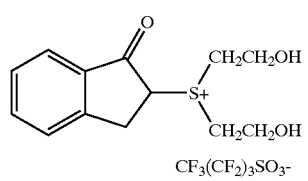
I-59
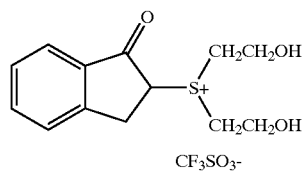
I-60
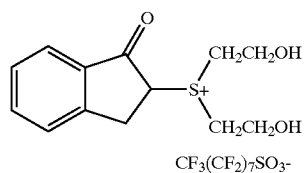
I-61
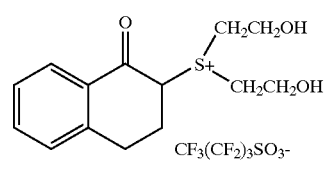
I-62
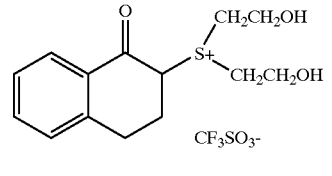
I-63
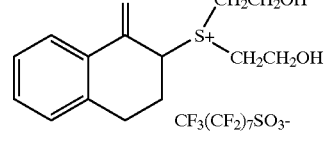
-continued
I-64
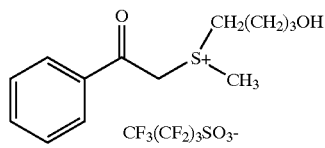
I-65
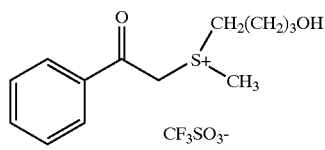
I-66
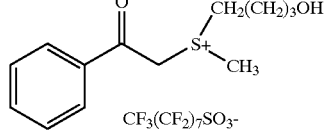
I-67
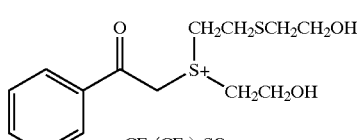
I-68
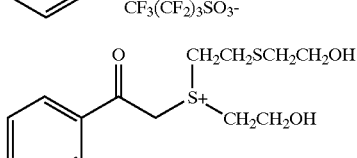
I-69
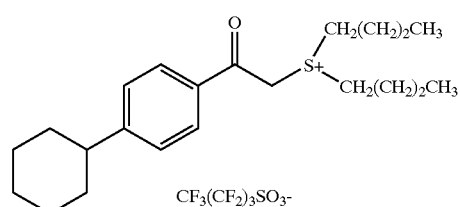
I-70
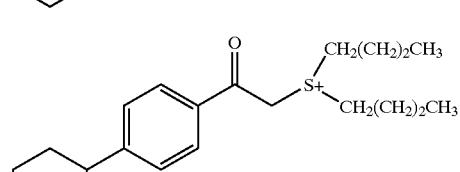
I-71
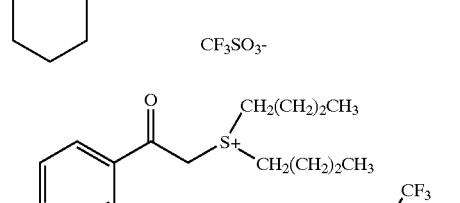
I-72
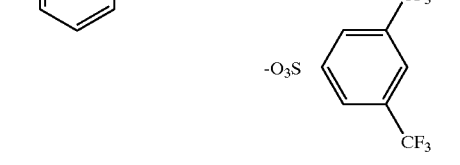

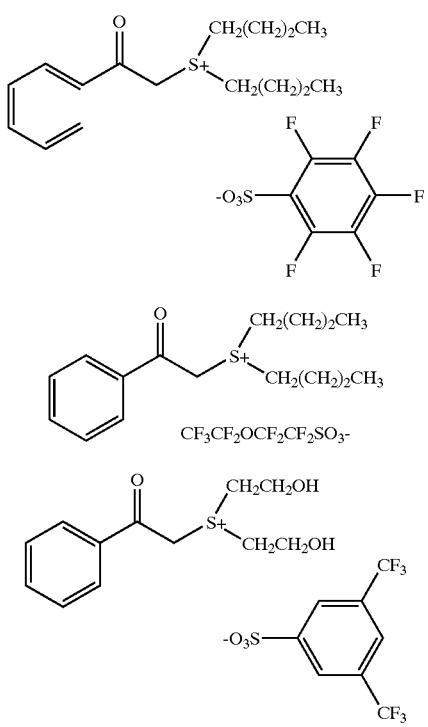

The compounds of formula (I) can be used either individually or as a combination of two or more thereof as component (B).

The compound of formula (I) is obtained by reacting a phenacyl halogenide derivative, such as phenacyl bromide, with a sulfide in an appropriate solvent in the presence or absence of a silver catalyst to form a phenacyldialkylsulfonium salt, which is subjected to salt exchange with a desired anion.

Component (B) is used in an amount preferably of from 0.1 to 20% by weight, still preferably 0.5 to 10% by weight, particularly preferably 1 to 7% by weight, based on the solids content of the positive resist composition.

If desired, component (B) can be used in combination with (D) another acid generator capable of generating an acid on exposure to active light rays or a radiation other than the compound of formula (I).

The acid generator which can be used as component (D) is appropriately selected from compounds capable of generating an acid on exposure to known light sources (e.g., ultraviolet rays of 200 to 400 nm, far ultraviolet rays (especially g-lines, h-lines, i-lines, and KrF excimer laser light)), ArF excimer laser light, electron beams, X-rays, molecular beams or ion beams, which are used as photo initiators for photo-cationic polymerization, photo initiators for photo-radical polymerization, photobleaching agents for dyes, photo-discoloring agents, compounds used in microresists, and the like.

Further included in component (D) are onium salts, such as diazonium salts, ammonium salts, phosphonium salts, iodonium salts, sulfonium salts, selenonium salts, and arsonium salts; organic halogen compounds; organometallic/organohalogen compounds; acid generators having an o-nitrobenzyl type protective group; compounds generating sulfonic acid on photolysis which are represented by iminosulfonates; disulfone compounds; diazoketosulfone compounds; and diazodisulfone compounds.

Polymers having the acid generating compound recited above or an acid-generating group derived therefrom in the main or side chain thereof are also useful as component (D) Additional useful acid generators are described in V. N. R. Pillai, *Synthesis*, 1980, (1), 1, A. Abd, et al., *Tetrahedron Lett.*, 1971, (47), 4555, D. H. R. Barton, et al.,*J. Chem. Soc.*, 1970, (C), 329, U.S. Pat. No. 3,779,778, and EP126,712.

Of the above-recited acid generators (D), the following four groups of compounds are particularly effective. (D1) Oxazole derivatives and s-triazine derivatives having a trihalomethyl group, represented by formulae (PAG1) and (PAG2), respectively.

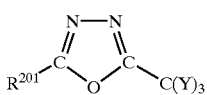
(PAG1)

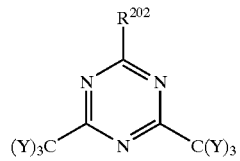
(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or —$C(Y)_3$; and Y represents a chlorine atom or a bromine atom.

Illustrative examples of the group (D1) compounds are shown below.

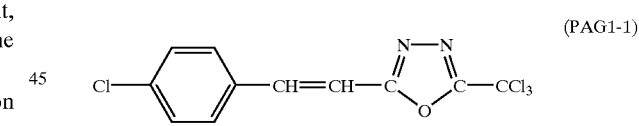
(PAG1-1)

(PAG1-2)

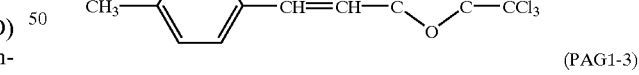
(PAG1-3)

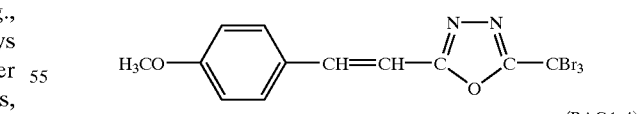
(PAG1-4)

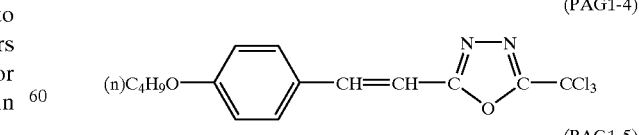
(PAG1-5)

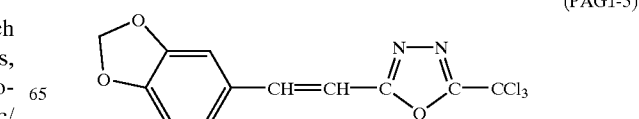

(PAG1-6)
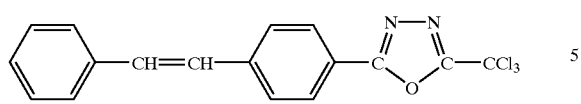
(PAG1-7)
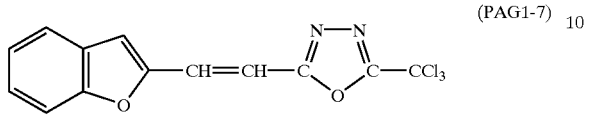
(PAG1-8)
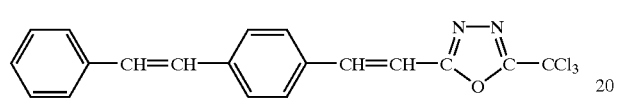
(PAG2-1)
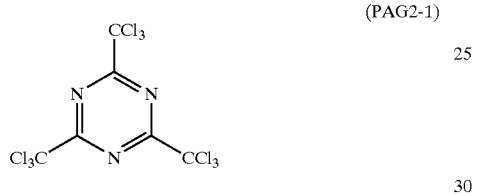
(PAG2-2)
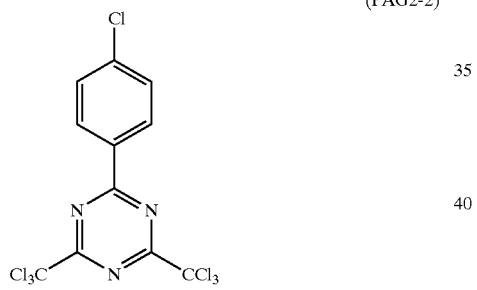
(PAG2-3)
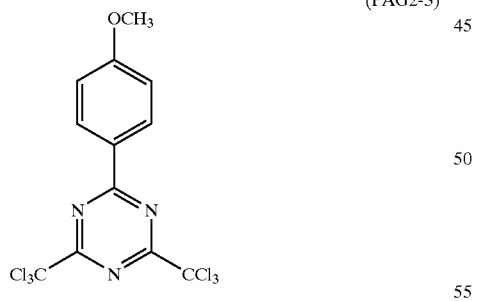
(PAG2-4)
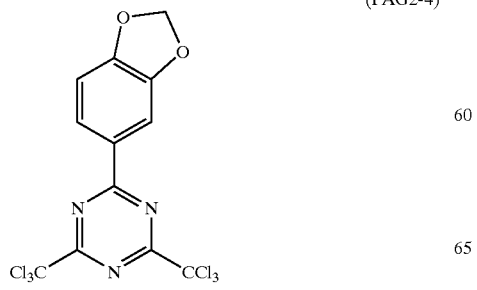
(PAG2-5)
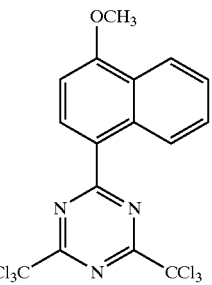
(PAG2-6)
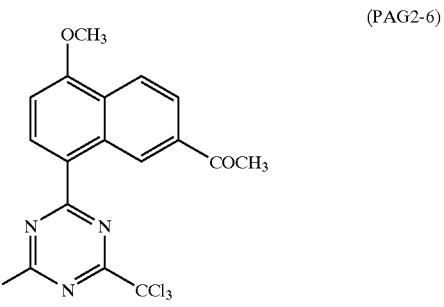
(PAG2-7)
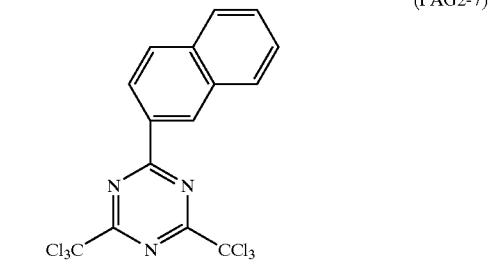
(PAG2-8)
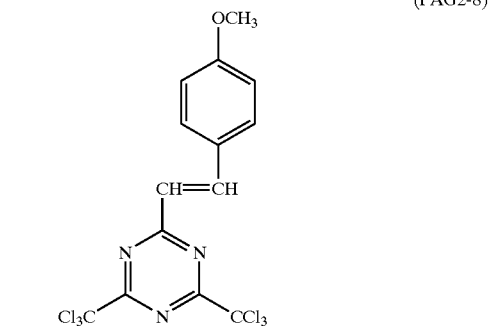
(PAG2-9)
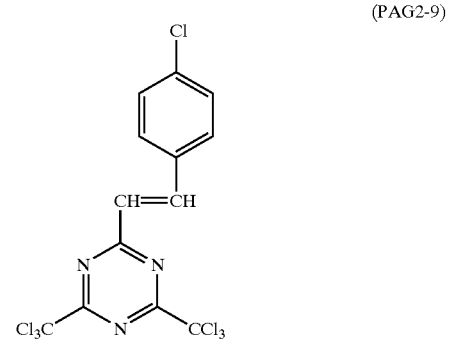

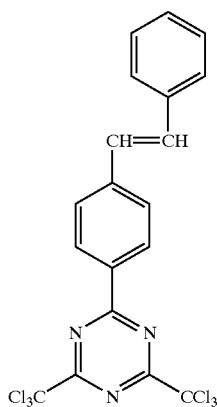
(PAG2-10)

(D2) Iodonium salts represented by formula (PAG3) and sulfonium salts represented by formula (PAG4):

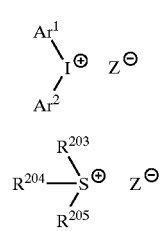
(PAG3)

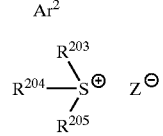
(PAG4)

wherein $Ar^1$ and $Ar^2$ each represent a substituted or unsubstituted aryl group; $R^{203}$, $R^{204}$, and $R^{205}$ each represent a substituted or unsubstituted alkyl group or a substituted or unsubstituted aryl group; $Z^-$ represents a counter anion; $Ar^1$ and $Ar^2$ may be connected via a single bond or a substituent; and two out of $R^{203}$, $R^{204}$, and $R^{205}$ may be connected via a single bond or a substituent.

The counter anion $Z^-$ includes, but is not limited to, $BF_4^-$, $AsF_6^-$, $PF_6^-$, $SbF_6^-$, $SiF_6^{2-}$, $ClO_4^-$, perfluoroalkanesulfonate anions (e.g., $CF_3SO_3^-$), alkylsulfonate anions (e.g., camphorsulfonate anion), aromatic sulfonate anions (e.g., pentafluorobenzenesulfonate anion, benzenesulfonate anion, and triisopropylbenzenesulfonate anion), condensed polynucleic aromatic sulfonate anions (e.g., naphthalene-1-sulfonate anion), an anthraquinonesulfonate anion, and sulfonic group-containing dye anions. These anion species may have a substituent.

Illustrative examples of the group (D2) compounds are shown below.

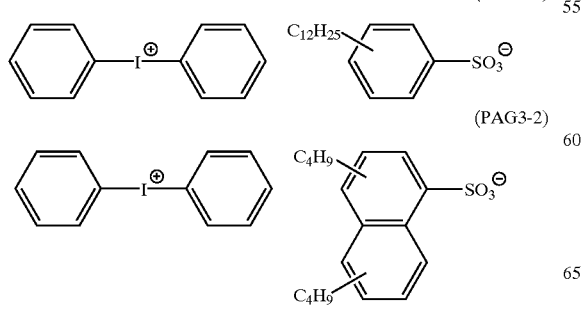
(PAG3-1)

(PAG3-2)

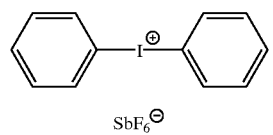
(PAG3-3)

(PAG3-4)

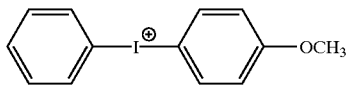
(PAG3-5)

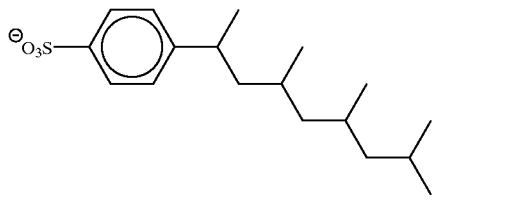
(PAG3-6)

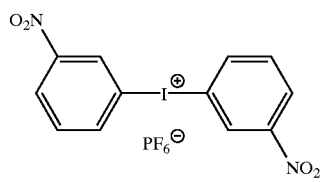
(PAG3-7)

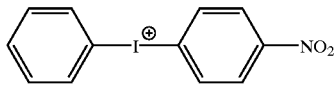
(PAG3-8)

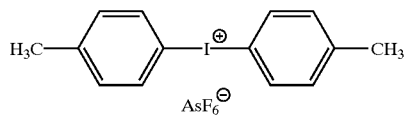
(PAG3-9)

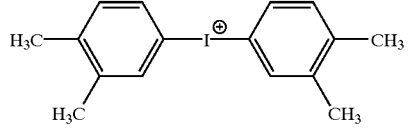

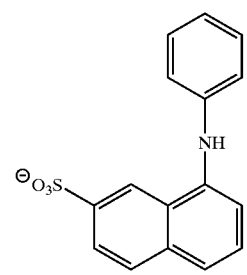

-continued
(PAG3-10)
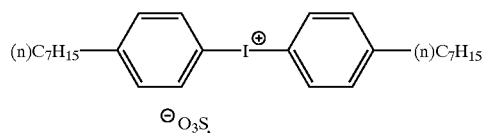
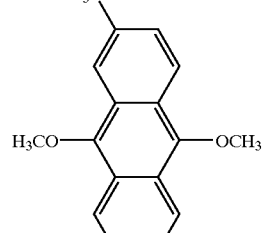
(PAG3-11)
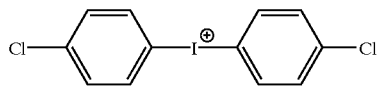
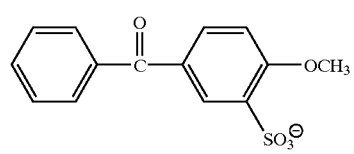
(PAG3-12)
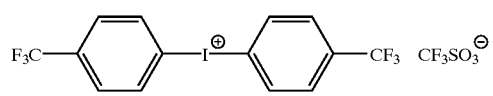
(PAG3-13)
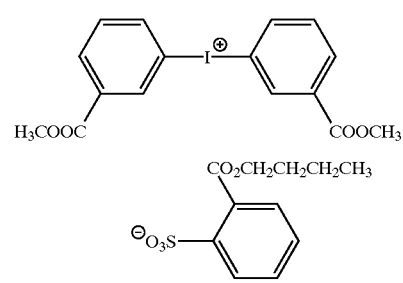
(PAG3-14)
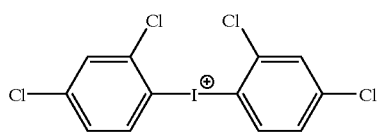
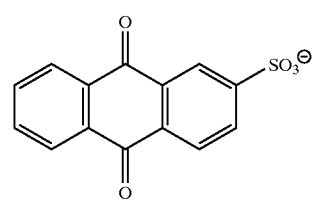
(PAG3-15)
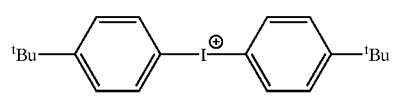
-continued
(PAG3-16)
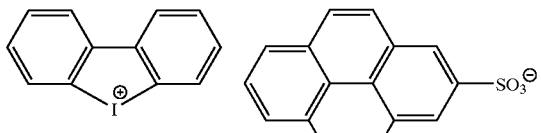
(PAG3-17)
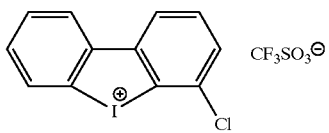
(PAG3-18)
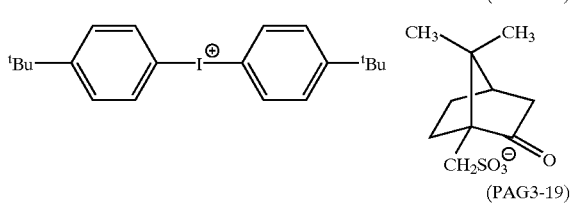
(PAG3-19)
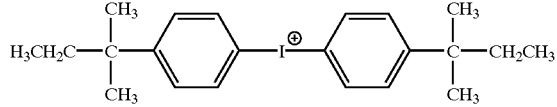
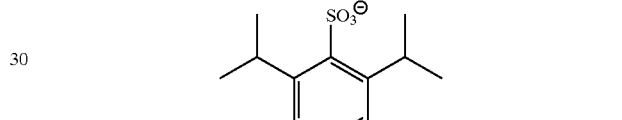
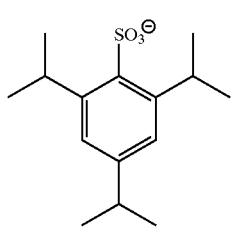
(PAG3-20)
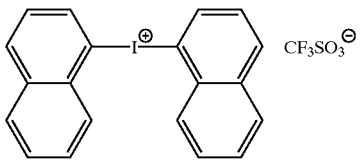
(PAG3-21)
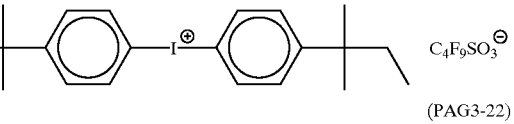
(PAG3-22)
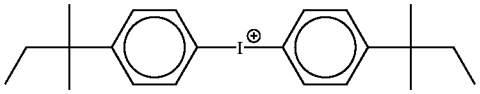
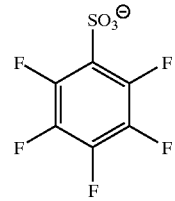
(PAG3-23)
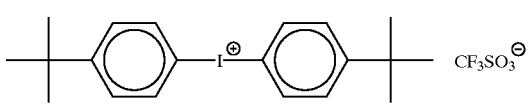

(PAG3-24)
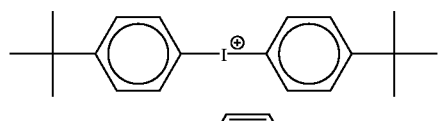
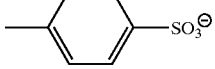
(PAG3-25)
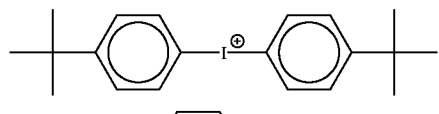
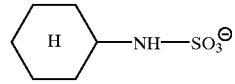
(PAG4-1)
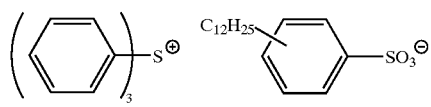
(PAG4-2)
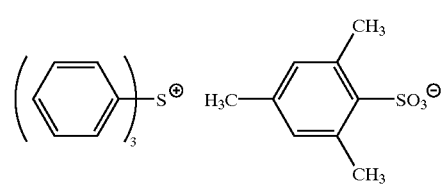
(PAG4-3)
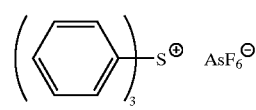
(PAG4-4)
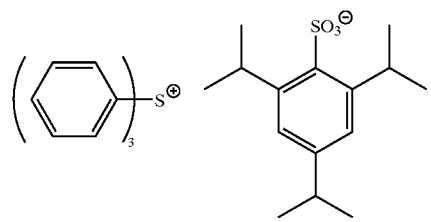
(PAG4-5)
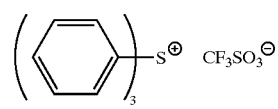
(PAG4-6)
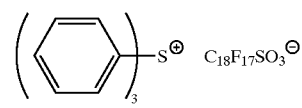
(PAG4-7)
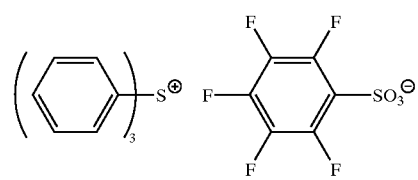
(PAG4-8)
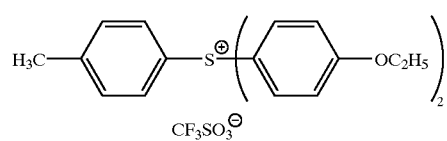
(PAG4-9)
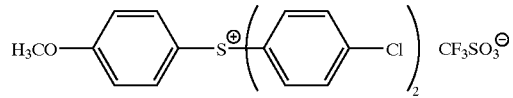
(PAG4-10)
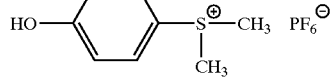
(PAG4-11)
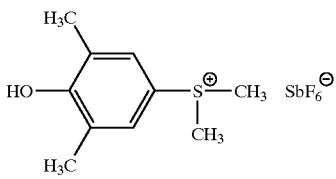
(PAG4-12)
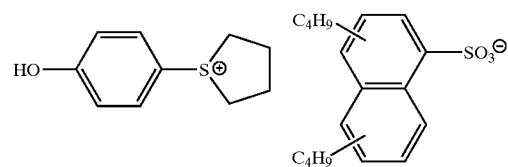
(PAG4-13)
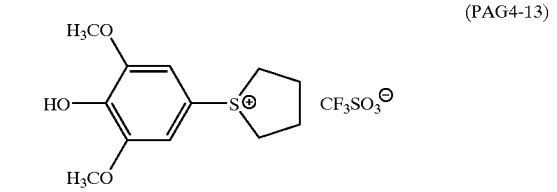
(PAG4-14)
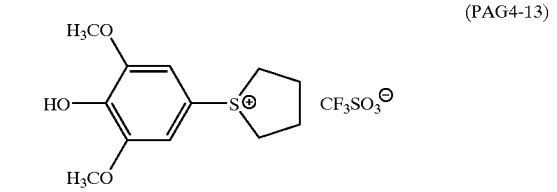
(PAG4-15)
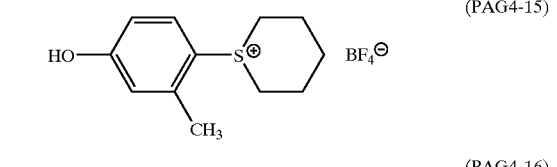
(PAG4-16)
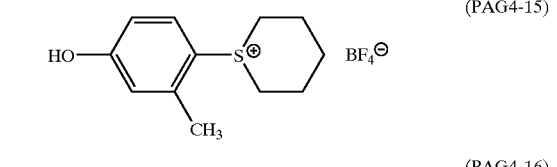
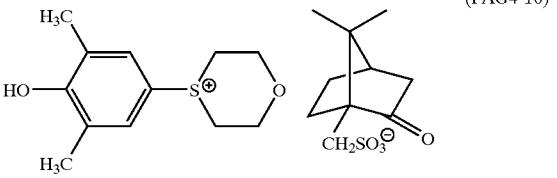
(PAG4-17)
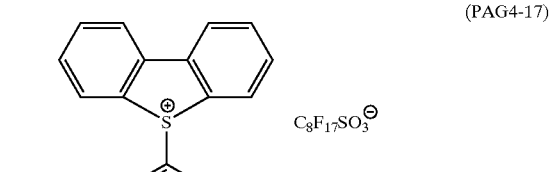
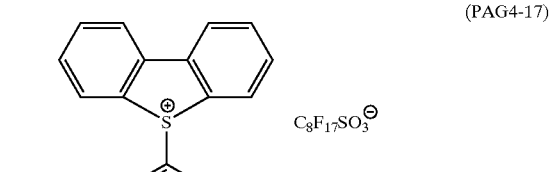

(PAG4-18) through (PAG4-33): chemical structures of photoacid generators.

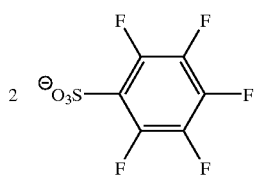
(PAG4-34)

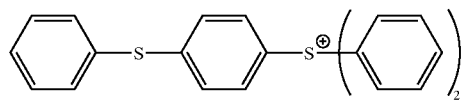
(PAG4-35)

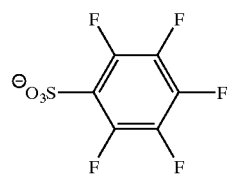
(PAG4-36)

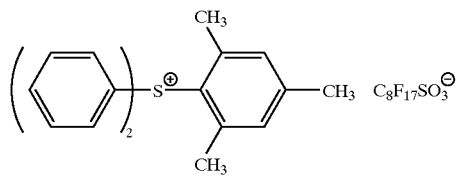
PAG4-37

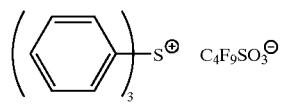

The onium salts represented by formulae (PAG3) and (PAG4) are known compounds, which can be synthesized by the processes taught in J. W. Knapczyk et al., *J. Am. Chem. Soc.*, 1969, 91, 145, A. L. Maycok et al., *J. Org. Chem.*, 1970, 35, 2532, E. Goethas et al., *Bull. Soc. Chem. Belg.*, 1964, 73, 546, H. M. Leicester, *J. Ame. Chem. Soc.*, 1929, 51, 3587, J. V. Crivello et al., *J. Polym. Chem. Ed.*, 1980, 18, 2677, U.S. Pat. Nos. 2,807,648 and 4,247,473 and JP-A-53-101331 (the term "JP-A" as used herein means an "unexamined published Japanese patent application").

(D3) Disulfone derivatives represented by formula (PAG5) and iminosulfonate derivatives represented by formula (PAG6):

$$Ar^3-SO_2-SO_2-Ar^4 \quad (PAG5)$$

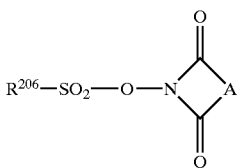
(PAG6)

wherein $Ar^3$ and $Ar^4$ each represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Illustrative examples of the group (D3) compound are listed below.

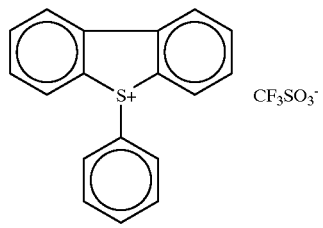

(PAG5-10)
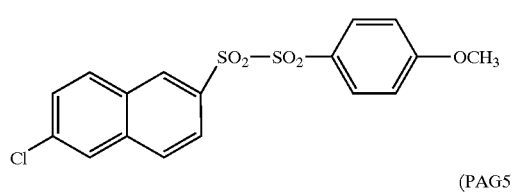
(PAG5-11)
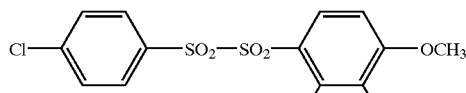
(PAG5-12)
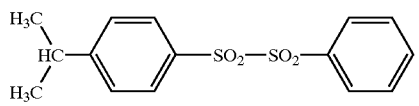
(PAG5-13)
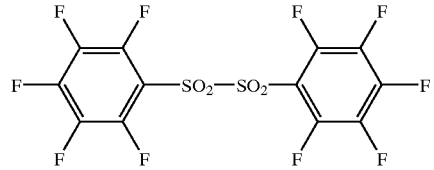
(PAG5-14)
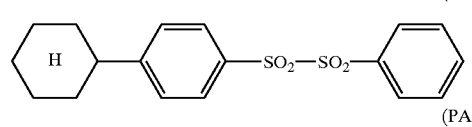
(PAG5-15)
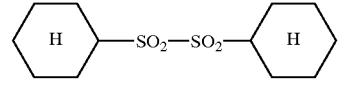
(PAG6-1)
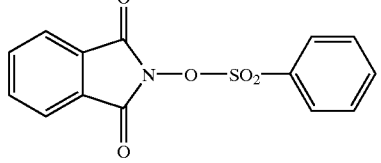
(PAG6-2)
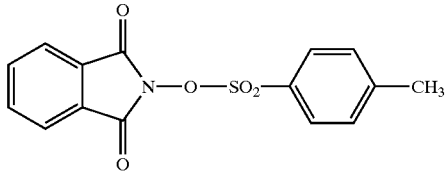
(PAG6-3)
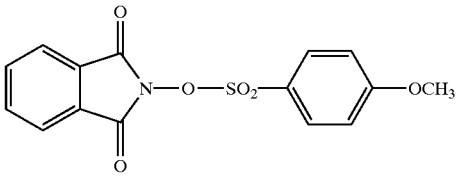
(PAG6-4)
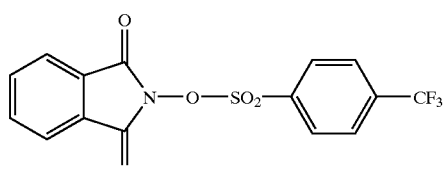
(PAG6-5)
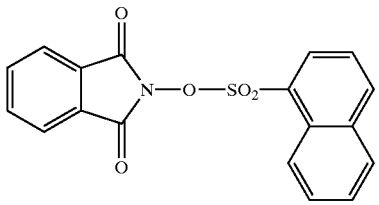
(PAG6-6)
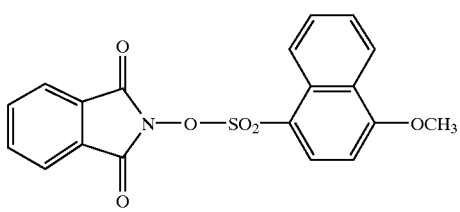
(PAG6-7)
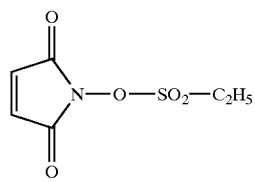
(PAG6-8)
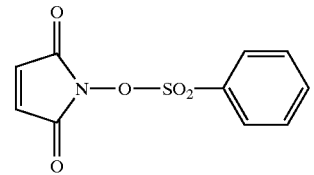
(PAG6-9)
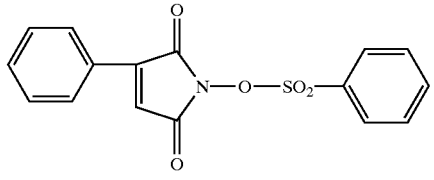
(PAG6-10)
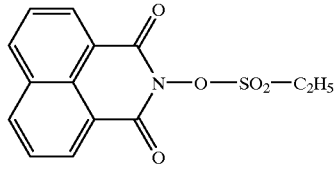
(PAG6-11)
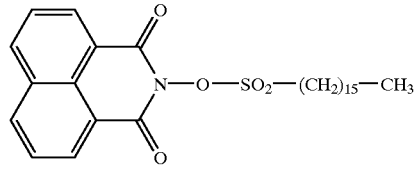
(PAG6-12)
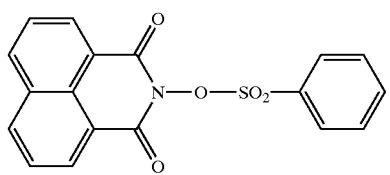

(PAG6-13) 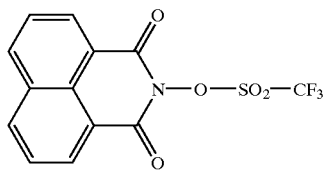

(PAG6-14) 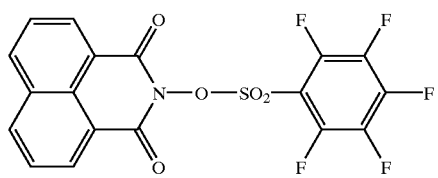

(PAG6-15) 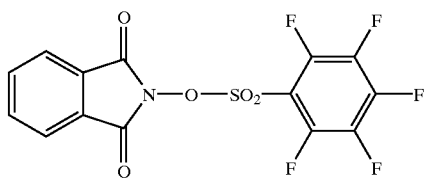

(PAG6-16) 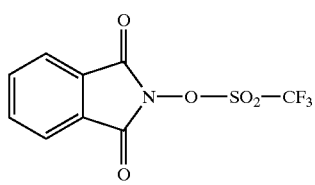

(PAG6-17) 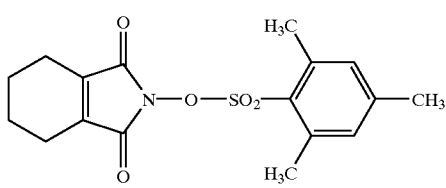

(PAG6-18) 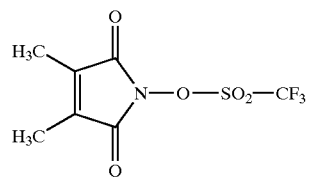

(PAG6-19) 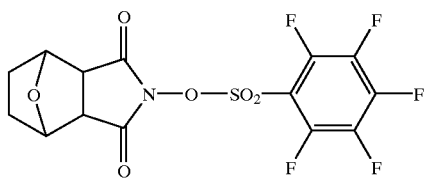

(PAG6-20) 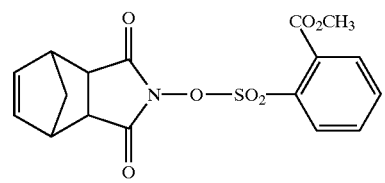

(D4) Diazodisulfone derivatives represented by formula (PAG7):

(PAG7) 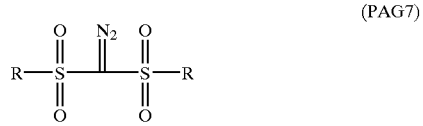

wherein R represents a straight-chain, branched or cyclic alkyl group or a substituted or unsubstituted aryl group.

Illustrative examples of the group (D4) compounds are shown below.

(PAG7-1) 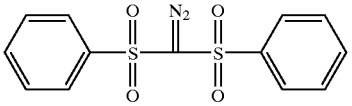

(PAG7-2) 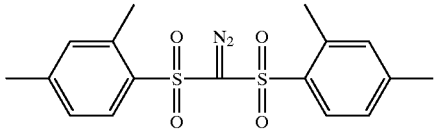

(PAG7-3) 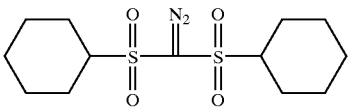

(PAG7-4) 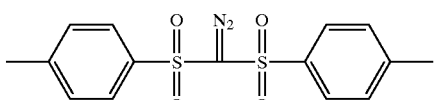

(PAG7-5) 

The acid generator as component (D), while not essential to the resist composition of the invention, is preferably used in combination with component (B) for obtaining further improvement in various resist performance characteristics such as sensitivity and resolution. Component (D) is usually used in an amount of 0.1 to 30% by weight, preferably 0.5 to 20% by weight, still preferably 1 to 15% by weight, based on the solids content of the total resist composition. Amounts of component (D) less than 0.1% result in reduced sensitivity. Amounts exceeding 30% can result in excessive light absorption, leading to deterioration of profile and film-forming properties. Component (D) may be one or more than one compounds.

A suitable weight ratio of component (B) and component (D) ranges from 100/0 to 5/95, preferably 95/5 to 10/90, still preferably 90/10 to 20/80.

It is preferred for the resist composition of the invention to further contain (C) an organic basic compound as an acid scavenger. An organic basic compound that is more basic than phenol is preferred as component (C). Addition of the organic basic compound is effective in suppressing performance change with time from exposure to post-exposure baking. Nitrogen-containing basic compounds represented by structures (a) to (e) shown below are particularly preferred.

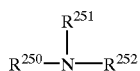
(a)

wherein $R^{250}$, $R^{251}$, and $R^{252}$, which may be the same or different, each represent a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms; $R^{251}$ and $R^{252}$ may be taken together to form a ring.

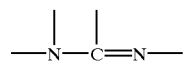
(b)

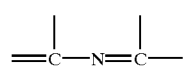
(c)

(d)

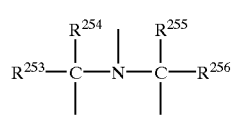
(e)

wherein $R^{253}$, $R^{254}$, $R^{255}$, and $R^{256}$, which may be the same or different, each represent an alkyl group having 1 to 6 carbon atoms.

Still preferred basic compounds are (C1) nitrogen-containing cyclic compounds and (C2) basic nitrogen-containing compounds having two or more nitrogen atoms in different chemical environments per molecule.

It is preferred for the nitrogen-containing cyclic compounds (C1) be polycyclic. Preferred nitrogen-containing polycyclic compounds are represented by formula (VI):

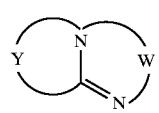
(VI)

wherein Y and W each represent a substituted or unsubstituted, straight-chain, branched or cyclic alkylene group which may contain a hetero atom.

The hetero atom Y or W may have includes nitrogen, sulfur, and oxygen. The alkylene group as Y or W preferably contains 2 to 10 carbon atoms, particularly 2 to 5 carbon atoms. The substituent the alkylene group may have includes an alkyl group having 1 to 6 carbon atoms, an aryl group, an alkenyl group, a halogen atom, and a halogen-substituted alkyl group.

Specific examples of the compound represented by formula (VI) are shown below.

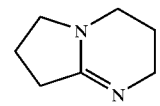
(VI-1)

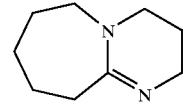
(VI-2)

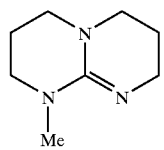
(VI-3)

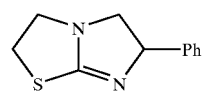
(VI-4)

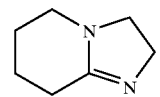
(VI-5)

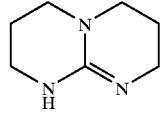
(VI-6)

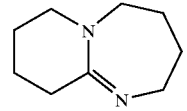
(VI-7)

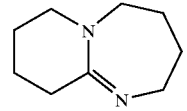
(VI-8)

Particularly preferred of them are 1,8-diazabicyclo[5.4.0]unde-7-ene and 1,5-diazabicyclo[4.3.0]non-5-ene.

The basic nitrogen-containing compound (C2) having two or more nitrogen atoms in chemically different environments per molecule preferably includes a compound having a substituted or unsubstituted amino group and a nitrogen-containing cyclic structure per molecule and a compound having an alkylamino group. Suitable examples thereof are substituted or unsubstituted guanidine, substituted or unsubstituted aminopyridine, substituted or unsubstituted aminoalkyl pyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. Preferred substituents in these compounds include amino, aminoalkyl, alkylamino, aminoaryl, arylamino, alkyl, alkoxy, acyl, acyloxy, aryl, aryloxy, nitro, hydroxyl, and cyano.

Compounds particularly preferred as component (C) include, but are not limited to, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole.

The organic basic compounds can be used either individually or as a combination of two or more thereof as component (C). Component (C) is usually used in an amount of 0.001 to 10% by weight, preferably 0.01 to 5% by weight, based on the solids content of the resist composition. When added in amounts less than 0.001%, component (C) produces insubstantial effects of addition. Amounts more than 10% can result in reduction of sensitivity or developability of exposed areas.

The positive resist composition of the invention contains a solvent. Suitable solvents include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate.

These solvents can be used either individually or as a combination thereof. Selection of a solvent is important because a solvent governs uniform dissolution of the positive resist composition which is influential on the coating properties of the resulting composition on a substrate and the storage stability of the resulting composition. It is desirable for the solvent to have as small a water content as possible because a water content influences the resist performance.

It is advisable to reduce impurities, such as metallic impurities and chloride ion content, of the resist composition to 100 ppb or lower. These impurities, if present in quantity, can invite behavioral faults, defects, or yield reduction in semiconductor device fabrication.

The positive resist composition is dissolved in a selected solvent in a solid concentration preferably of 3 to 40%, still preferably 5 to 30%, particularly preferably 7 to 20%, by weight.

After dissolving the resist composition in a solvent, the resulting solution is preferably filtered through a filter having an opening size of about 0.05 to 0.2 μm to remove foreign matter therefrom.

If desired, the positive resist composition can contain surface active agents, acid-decomposable compounds suppressing alkali solubility, dyes, plasticizers, photosensitizers, crosslinking agents, photo-base generators, heat-base generators, spectral sensitizers, compounds accelerating dissolution in a developing solution, compounds which reduce their basicity on exposure (photo-bases), and so forth.

The surface active agents which can be preferably used in the invention include fluorine-containing ones, silicon-containing ones, and those containing both fluorine and silicon. They can be used either individually or as a combination thereof.

Examples of suitable surface active agents are described, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511, and 5,824,451. Commercially available fluorine- and/or silicon-containing surface active agents which can be used in the present invention include EFTOP series EF301 and EF303 (from Shin Akita Kasei K.K.); Fluorad series FC430 and FC431 (from Sumitomo 3M Ltd.); Megafac series F171, F173, F176, F189, and R08 (from Dainippon Ink & Chemicals Inc.); Surflon series S-382, SC101, 102, 103, 104, 105 and 106 (from Asahi Glass Co., Ltd.); and Troy Sol S-366 (from Troy Chemical Industries, Inc.). Polysiloxane polymer KP-341 (from Shin-Etsu Chemical Co., Ltd.) is also useful as a silicon-containing surface active agent.

The above-described surface active agents are used in an amount of 0.001 to 2% by weight, preferably 0.01 to 1% by weight, based on the solids content of the resist composition. These surface active agents can be used either individually or as a combination of two or more thereof.

In addition to the fluorine- and/or silicon-containing surface active agents, the resist composition can contain nonionic surface active agents, such as polyoxyethylene alkyl ethers, e.g., polyoxyethylene lauryl ether, polyoxyethylene stearyl ether, polyoxyethylene cetyl ether, and polyoxyethylene oleyl ether; polyoxyethylene alkylaryl ethers, e.g., polyoxyethylene octylphenyl ether and polyoxyethylene nonylphenyl ether; ethylene oxide-propylene oxide block copolymers; sorbitan fatty acid esters, e.g., sorbitan monolaurate, sorbitan monopalmitate, sorbitan monostearate, sorbitan monooleate, sorbitan trioleate, and sorbitan tristearate; polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate. These nonionic surface active agents can be used in an amount usually of 2% by weight or less, preferably 1% by weight or less, based on the solids content of the resist composition.

The acid-decomposable compounds suppressing alkali solubility which can be used in the invention include the low-molecular compounds disclosed in JP-A-5-134415 and JP-A-6-51519.

The plasticizers which can be used in the invention include the compounds disclosed in JP-A-4-212960, JP-A-

8-262720, EP735422, EP416873, EP439371, and U.S. Pat. No. 5,846,690, such as di(2-ethylhexyl)adipate, n-hexyl benzoate, di-n-octyl phthalate, di-n-butyl phthalate, benzyl-n-butyl phthalate, and dehydroabietyl phthalate.

The compounds accelerating dissolution in a developing solution which can be used in the invention include polyhydroxy compounds disclosed in JP-A-4-134345, JP-A-4-217251, JP-A-7-181680, JP-A-8-211597, and U.S. Pat. Nos. 5,688,628 and 5,972,559. Suitable are aromatic polyhydroxy compounds, such as 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)hexane, 1,2-tetrakis(4-hydroxyphenyl)ethane, 1,1,3-tris(hydroxyphenyl)butane, and p-[α,α,α',α'-tetrakis(4-hydroxyphenyl)]-xylene.

Other compounds capable of accelerating dissolution in a developing solution which can be used in the invention include organic acids, such as salicylic acid, diphenolic acid, and phenolphthalein; sulfonamide compounds disclosed in JP-A-5-181263 and JP-A-7-92680; carboxylic acids or anhydrides thereof disclosed in JP-A-4-248554, JP-A-5-181279, and JP-A-7-92679; and alkali-soluble resins disclosed in JP-A-11-153869, e.g., polyhydroxystyrene resins.

The dyes which can be suitably used in the invention include oil soluble dyes and basic dyes. Examples thereof are Oil Yellow #101, Oil Yellow #103, Oil Pink #312, Oil Green BG, Oil Blue BOS, Oil Blue #603, Oil Black BY, Oil Black BS, and Oil Black T-505 (all available from Orient Chemical Industries, Ltd.); Crystal Violet (C.I. 42555), Methyl Violet (C.I. 42535), Rhodamine B (C.I. 45170B), Malachite Green (C.I. 42000), and Methylene Blue (C.I. 52015).

The compounds which can be added to the resist composition of the invention further include the ammonium salts described in JP-A-7-28247, EP616258, U.S. Pat. No. 5,525,443, JP-A-9-127700, EP762207, and U.S. Pat. No. 5,783,354, such as tetramethylammonium hydroxide, tetra-n-butylammonium hydroxide, and betaines; and the compounds decreasing their basicity on exposure (photo-bases) which are disclosed in JP-A-5-232706, JP-A-6-11835, JP-A-6-2422606, JP-A-6-266100, JP-A-7-333851, JP-A-7-333844, U.S. Pat. No. 5,663,035, and EP677788.

The positive resist composition can be rendered sensitive to the longer wavelength region than the far ultraviolet region, such as i-lines or g-lines in which the photo-acid generator used in the composition shows no absorptions by adding spectral sensitizers. Suitable spectral sensitizers include, but are not limited to, benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavine, setoflavine T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-t-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), and coronene.

These spectral sensitizers are also serviceable as a far ultraviolet absorbent, which absorbs the reflected light from the substrate to lessen the adverse influences of multiple reflection in the resist film thereby to reduce the standing wave effects.

The photo-base generators which can be used in the invention include those described in JP-A-4-151156, JP-A-4-162040, JP-A-5-197148, JP-A-5-5995, JP-A-6-194834, JP-A-8-146608, JP-A-10-83079, and EP622682, such as 2-nitrobenzyl carbamate, 2,5-dinitrobenzylcyclohexyl carbamate, N-cyclohexyl-4-methylphenyl sulfonamide, and 1,1-dimethyl-2-phenylethyl N-isopropylcarbamate. The photo-base generator is added to improve resist profile and the like.

The heat-base generators which can be used in the invention include the compounds described in JP-A-5-158242, JP-A-5-158239, and U.S. Pat. No. 5,576,143.

The positive resist composition of the present invention is used as a second layer (upper resist layer) on a first layer (lower resist layer) to form a two-layer photoresist on a substrate, such as a silicon wafer with a silicon dioxide coat, glass, ceramics, or metals. The composition as dissolved in a solvent is applied to the first layer (lower resist layer) by spin coating, spray coating or like methods.

Aqueous alkali solutions are used as a developing solution for the second layer of the two-layer resist film. The alkali includes in organic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and methyldiethylamine; alcohol amines, such as dimethylethanolamine and triethanolamine; quaternary ammonium salts, such as tetramethylammonium hydroxide and tetraethylammoniumhydroxide; and cyclic amines, such as pyrrole and piperidine. The aqueous alkali solution may contain adequate amounts of alcohols, surface active agents, and aromatic hydroxy compound. A developing solution containing tetramethylammonium hydroxide is the most preferred.

Appropriate organic polymer films can be used to form the first resist layer. Various known photoresists can be utilized, such as FH series and FHi series available from Fuji Film Arch Co., Ltd. and PFI series from Sumitomo Chemical Co., Ltd. The first resist layer is formed in the same manner as with the positive resist composition of the present invention. The thickness of the first resist layer is preferably 0.1 to 4.0 μm, still preferably 0.2 to 2.0 μm. Thicknesses smaller than 0.1 μm are unfavorable from the viewpoint of reflection prevention and dry etching resistance. Thicknesses larger than 4.0 μm result in formation of a resist pattern with too high an aspect ratio, which is liable to collapse.

The first resist layer can also be formed by coating the substrate with a liquid resist composition by spin coating, spray coating or a like method. The thickness of the first resist layer is preferably 0.1 to 2.0 μm, still preferably 0.2 to 1.5 μm, particularly preferably 0.25 to 1.2 μm. Thicknesses smaller than 0.1 μm are unfavorable from the viewpoint of reflection prevention and dry etching resistance. Thicknesses larger than 2.0 μm result in formation of a resist pattern with too high an aspect ratio, which is liable to collapse.

Before applying the positive resist composition of the invention, the first resist layer is preferably heat treated. The heating temperature preferably ranges 150 to 250° C., particularly 170 to 240° C., especially 180 to 230° C. At temperatures lower than 150° C., the first resist layer tends to undergo intermixing with the second resist layer applied thereon. Temperatures higher than 250° C. can decompose the polymer of the first layer. The heating time depends on the heating temperature. In a range of 180 to 230° C., for example, the heating time is preferably 10 to 1000 seconds, still preferably 20 to 600 seconds. In shorter heating times than 10 seconds, heat curing of the polymer would be insufficient for preventing intermixing between the first and second layers. In longer times than 1000 seconds, the throughput of wafers fells. The heat treatment is usually carried out on a hot plate or in an oven.

The second resist layer is then formed on the first layer in the same manner as for the first layer. The thickness of the second layer is preferably 0.03 to 0.6 μm, still preferably 0.04 to 0.5 μm, particularly preferably 0.05 to 0.45 μm. A layer thinner than 0.03 μm tends to have poor capability of transferring its pattern to the underlying first layer or suffer from pinholes. A layer thicker than 0.6 μm has poor lithographic performance.

The two-layer resist thus formed is subjected to the step of patterning. In the first stage of patterning, the second resist layer is exposed to high energy rays through a mask after, if necessary, mask alignment to an existing pattern. The exposed part of the second layer, which has been made alkali-soluble by exposure, is removed with an alkaline developing solution to leave a positive pattern.

In the second stage of patterning, the first resist layer is dry-etched by an oxygen plasma using the patterned second resist layer as a mask to form a micropattern with a high aspect ratio profile. The oxygen plasma etching of the organic polymer film is exactly the same as the plasma ashing for resist removal after substrate etching in conventional photoetching. The oxygen plasma etching is performed in, for example, a cylindrical plasma etching system using oxygen as a reactive gas (etchant gas). Oxygen gas containing sulfurous acid gas, etc. may be used.

EXAMPLES

The present invention will now be illustrated in greater detail with reference to Examples, but it should be understood that the invention is by no means limited thereto.

Synthesis Example 1
Synthesis of Acid Generator (I-1):

A solution of 16.0 g of phenacyl bromide and 12.4 g of di-n-butyl sulfide in 50 ml of acetonitrile was added dropwise to a mixture of 16.4 g of silver tetrafluoroborate and 150 ml of acetonitrile over a 30 minute period. The reaction mixture was stirred at room temperature overnight, followed by concentration to precipitate powder, which was washed with diisopropyl ether to give 27 g of phenacyl di-n-butylsulfonium tetrafluoroborate. A 10 g portion of the product was dissolved in 200 ml of methanol, and 10.1 g of potassium nonafluorobutanesulfonate was added thereto. After the reaction mixture was stirred at room temperature for 1 hour, 500 ml of chloroform was added thereto. The reaction mixture was washed with two 300 ml portions of distilled water. The organic layer was concentrated to yield 9.8 g of acid generator (I-1).

Other acid generators according to the present invention were synthesized in the same manner as described above.

Synthesis Example 2
Synthesis of Resin 9:

To 34 g of tetrahydrofuran (THF) were added 10.4 g of trimethylallylsilane, 9.8 g of maleic anhydride, and 5.3 g of t-butyl acrylate, and the mixture was heated to 65° C. in a nitrogen stream. When the temperature became steady, an initiator V-65 (available from Wako Pure Chemical Industries, Ltd.) was added in an amount of 10 mol % based on the total mole number of the monomers described above to initiate polymerization. Six hours later, the reaction mixture was two-fold diluted with THF and poured into a large quantity of hexane to precipitate white powder. To reduce residual monomers and low-molecular components, the precipitated powder was dissolved in acetone, and hexane was added thereto in small portions to precipitate the polymer. The polymer was washed with a mixed solvent of hexane and acetone (8/2 by weight) and dried under reduced pressure to obtain resin 9. Gel-permeation chromatography (GPC) analysis revealed that resin 9 had a polystyrene equivalent weight average molecular weight of 5600 and contained 4% of components having molecular weights of 1000 or lower as calculated from the area ratio of the chromatogram.

Resins 1 to 19 were synthesized in the same manner as for resin 9.

Synthesis Example 3
Synthesis of Resin 22:

To 200 ml of THF was added 29.1 g of tris(trimethylsilyl)-2-hydroxyethylsilane, and 11.2 g of 4-dimethylaminopyridine was added thereto. The reaction mixture was cooled to 0° C., and 14.0 g of acrylic acid chloride was added thereto dropwise over 1 hour. The reaction was continued for an additional 5 hour period while cooling the reaction mixture to room temperature. The reaction mixture was concentrated under reduced pressure and purified by silica gel column chromatography to prepare an acrylate monomer.

In THF were dissolved 18.0 g of the acrylate monomer, 9.5 g of maleic anhydride, and 3.8 g of methacrylic acid to prepare a solution having a solids content of 50 wt %. The solution was put into a three-necked flask and heated to 60° C. in a nitrogen stream. When the temperature became steady, an initiator V-65 (available from Wako Pure Chemical Industries, Ltd.) was added in an amount of 5 mol % based on the total mole number of the monomers to initiate polymerization. Six hours later, the reaction mixture was two-fold diluted with THF and poured into a large quantity of hexane to precipitate white solid. The solid was collected by filtration and dried to give resin 22. GPC analysis revealed that resin 22 had a polystyrene equivalent weight average molecular weight of 6900.

Resins 20 to 35 were synthesized in the same manner as for resin 22.

Examples 1 to 11

1) Formation of Lower Resist Layer

A commercially available resist for i-lines (FHi-028DD available from Fuji Photo Arch Co., Ltd.) was applied to a 6-in. silicon wafer with a spin coater (Mark 8 supplied by Tokyo Electron Limited) and baked at 90° C. for 90 seconds to form a 0.55 μm thick uniform film, which was heated at 200° C. for 3 minutes to form a 0.40 μm thick lower resist layer.

2) Formation of Upper Resist Layer

The components shown in Tables 1 and 2 were compounded into a liquid resist, which was microfiltered through a membrane filter having an opening size of 0.1 μm. The mixing ratios of the mixed solvents shown in Table 1 are given by weight. The resulting resist composition was applied to the lower resist layer in the same manner as for the lower resist layer, heated at 130° C. for 90 seconds to form a 0.20 μm thick upper resist layer.

The two-layer resist film on the wafer was exposed to ArF excimer laser light at a varied dose through a resolution chart (mask) by use of Stepper 9300 supplied by ISI. After post-exposure baking at 120° C. for 90 seconds in a clean room, the resist was developed with a 2.38% tetramethylammonium hydroxide developing solution for 60 seconds, rinsed with distilled water, and dried to form an upper pattern. The lower resist layer was then etched (dry developed) in a parallel plate reactive ion etching system DES-245R supplied from Plasma System Inc. to form a lower pattern. The etching was carried out with oxygen as a reactive gas under a pressure of 20 mTorr at an applied power of 100 mW/cm$^2$. The resulting resist pattern was observed under a scanning electron microscope.

The resist pattern was evaluated in terms of resolution, contact hole pattern dimensional uniformity, DOF, and development defects as follows. The results obtained are shown in Tables 1 and 2.

(1) Resolution

Of the contact holes formed in the upper resist layer at an exposure dose for reproducing 0.15 μm-diameter contact holes (hole duty ratio=1:1) of the mask, the minimum size through which the lower resist layer could isolate the contact holes was taken as a resolution.

(2) Contact Hole Pattern Dimensional Uniformity

The size of 50 contact holes corresponding to the 0.15 μm-diameter holes of the mask which were selected from different positions on a 6-in. silicon wafer was measured with S-9200 from Hitachi, Ltd. A variance of (measured value–0.15 μm) was obtained to calculate 3σ. A smaller 3σ value means higher contact hole dimensional uniformity.

(3) DOF

The resist film was exposed at an optimum dose for resolving a 0.15 μm-diameter contact hole pattern (hole duty ratio=1:1) at a varied DOF. After post-exposure baking and development, the size of the reproduced contact holes was measured. The range of acceptable focus for reproducing the 0.15 μm-diameter contact hole pattern was taken as a DOF.

(4) Development Defects

The resulting wafer was inspected for development defects. The number of development defects was counted under an optical microscope by use of a patterned wafer inspection tool KLA Tencor (KLA-2112, supplied from KLA Tencor Corp.) (threshold: 12%; pixel size: 0.39 μm).

The components used in Examples are described below.

Component (B):
 B1: triphenylsulfonium-trifluoromethane sulfonate
 B2: tri(t-butylphenyl)sulfonium-perfluorobutane sulfonate Component (C):
 C1: 1,5-diazabicyclo[4.3.0]-5-nonene
 C2: 1,8-diazabicyclo[5.4.0]-7-undecene
 C3: 2-phenylbenzimidazole Surface Active Agent:
 W1: Megafac F176 (F-containing surfactant available from Dainippon Ink & Chemicals Inc.)
 W2: Megafac R08 (F- and Si-containing surfactant from Dainippon Ink & Chemical)
 W3: polysiloxane KP-341 (Si-containing surfactant from Shin-Etsu Chemical Co., Ltd.)
 W4: Fluorad FC430 (F-containing surfactant from Sumitomo 3M Ltd.)

Solvent:
 S1: methoxypropyl acetate
 S2: 2-methoxypropanol
 S3: ethyl lactate

Comparative Example 1

A resist composition was prepared in the same manner as in Example 1, except that the acid generator (I-1) as component (B) was not used. The composition was evaluated in the same manner as in Example 1. The results are shown in Table 1.

Comparative Example 2

A resist composition was prepared in the same manner as in Example 7, except that the acid generator (I-18) as component (B) was not used. The composition was evaluated in the same manner as in Example 1. The results are shown in Table 1.

Examples 12 to 15

Resist compositions were prepared in the same manner as in Example 1, except for replacing components (A), (B) and (C), the surfactant, and the solvent used in Example 1 with the respective compounds shown in Table 2. The resulting compositions were evaluated in the same manner as in Example 1, except for replacing ArF excimer laser stepper 9300 (ISI) with a KrF excimer laser stepper FPA3000EX-5 from Cannon Inc. and using a mask having a 0.18 μm-diameter contact hole pattern. The results obtained are shown in Table 2.

Comparative Example 3

A resist composition was prepared in the same manner as in Example 12, except that the acid generator (I-1) as component (B) was not used. The composition was evaluated in the same manner as in Example 12. The results are shown in Table 2.

Comparative Example 4

A resist composition was prepared in the same manner as in Example 14, except that the acid generator (I-15) as component (B) was not used. The composition was evaluated in the same manner as in Example 14. The results are shown in Table 2.

TABLE 1

|  | (A) (0.9 g) | (B) (0.05 g) | (C) (0.005 g) | Surfactant (0.001 g) | Solvent (9.0 g) | Resolution ($\mu$m) | DOF ($\mu$m) | Dimensional Uniformity (A) | Number of Development Defects |
|---|---|---|---|---|---|---|---|---|---|
| Example |  |  |  |  |  |  |  |  |  |
| 1 | 9 | I-1 | C1 | W1 | S1 | 0.125 | 1.0 | 50 | 4 |
| 2 | 18 | I-2 | C1 | W2 | S1/S2 = 75/25 | 0.115 | 1.1 | 40 | 7 |
| 3 | 3 | I-3 | C3 | W3 | S1 | 0.125 | 0.9 | 60 | 10 |
| 4 | 17 | I-7 | C3 | W2 | S1 | 0.120 | 0.9 | 50 | 3 |
| 5 | 19 | I-10 | C1 | W2 | S1 | 0.110 | 1.2 | 45 | 1 |
| 6 | 10 | I-13 | C2 | W1 | S1 | 0.115 | 1.1 | 65 | 5 |
| 7 | 24 | I-18 | C2 | W3 | S1 | 0.120 | 0.9 | 60 | 7 |
| 8 | 26 | I-19 | C1 | W2 | S1 | 0.125 | 1.0 | 65 | 10 |
| 9 | 29 | I-31 | C2 | W1 | S1/S3 = 85/15 | 0.125 | 0.8 | 60 | 9 |
| 10 | 18 | I-46 | C3 | W1 | S1 | 0.115 | 1.1 | 45 | 2 |
| 11 | 17 | I-61 | C1 | W2 | S1 | 0.115 | 1.2 | 50 | 5 |
| Comparative Example |  |  |  |  |  |  |  |  |  |
| 1 | 9 | B2 | C1 | W1 | S1 | 0.145 | 0.5 | 170 | 970 |
| 2 | 24 | B1 | C2 | W3 | S1 | 0.140 | 0.6 | 180 | 210 |

TABLE 2

|  | (A) (0.9 g) | (B) (0.05 g) | (C) (0.005 g) | Surfactant (0.001 g) | Solvent (9.0 g) | Resolution ($\mu$m) | DOF ($\mu$m) | Dimensional Uniformity (A) | Number of Development Defects |
|---|---|---|---|---|---|---|---|---|---|
| Example |  |  |  |  |  |  |  |  |  |
| 12 | 33 | I-1 | C1 | W1 | S1 | 0.150 | 1.0 | 50 | 1 |
| 13 | 18 | 1-10 | C3 | W2 | S1 | 0.145 | 1.1 | 55 | 3 |
| 14 | 9 | 1-15 | C2 | W1 | S1 | 0.160 | 1.2 | 55 | 2 |
| 15 | 31 | 1-46 | C1 | W3 | S1 | 0.155 | 1.2 | 60 | 5 |
| Comparative Example |  |  |  |  |  |  |  |  |  |
| 3 | 33 | B1 | C1 | W1 | S1 | 0.180 | 0.6 | 190 | 860 |
| 4 | 9 | B2 | C2 | W1 | S1 | 0.180 | 0.6 | 160 | 720 |

Comparisons between Examples 1 to 11 and Comparative Examples 1 to 2 and between Examples 12 to 15 and Comparative Examples 3 to 4 reveal the following: the positive resist compositions according to the present invention are capable of providing resist patterns which have higher contact hole pattern dimensional uniformity, a higher resolution, a deeper DOF, and fewer development defects than those formed with the comparative ones.

The positive resist composition of the present invention is sensitive to far ultraviolet light and excellent in critical dimension uniformity in resolving a micropattern of contact holes having diameters of 0.2 $\mu$m or smaller. It is capable of forming a resist pattern with a high resolution, a deep DOF and reduced development defects. Accordingly, the composition of the invention is extremely suited to the high-volume fabrication of semiconductor substrates with ultrafine circuit patterns.

This application is based on Japanese Patent application JP 2002-7635, filed Jan. 16, 2002, the entire content of which is hereby incorporated by reference, the same as if set forth at length.

What is claimed is:

1. A positive resist composition comprising:

(A) a polymer having a silicon atom in a side chain thereof, which is insoluble or sparingly soluble in an aqueous alkali solution and becomes soluble in an aqueous alkali solution by an action of an acid; and (B) an acid generator capable of generating an acid on exposure to active light rays or a radiation, which is represented by the following formula (I):

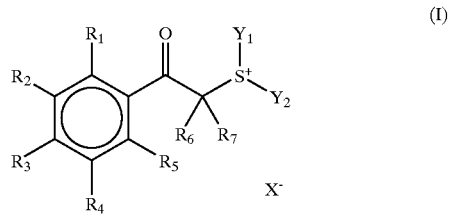

wherein $R_1$, $R_2$, $R_3$, $R_4$, and $R_5$, which are the same or different, each represent a hydrogen atom, a nitro group, a halogen atom, a substituted or unsubstituted alkyl group, a substituted or unsubstituted alkoxy group, a substituted or unsubstituted alkoxycarbonyl group, a substituted or unsubstituted aryl group or a substituted or unsubstituted acylamino group; at least two of $R_1$, $R_2$, $R_3$, $R_4$, and $R_5$ may be taken together to form a cyclic structure; $R_6$ and $R_7$, which are the same or different, each represent a hydrogen atom, a cyano group, a substituted or unsubstituted alkyl group or a substituted or unsubstituted aryl group; $Y_1$ and $Y_2$, which are the same or different, each represent a substituted or unsubstituted alkyl group which may contain an ether linkage or a sulfide linkage or a substituted or unsubstituted alkenyl group provided that, when $Y_1$ and $Y_2$ each represent an alkyl group, (i) at least one of them is an alkyl group having a hydroxyl group, an ether linkage or a sulfide linkage or (ii) $Y_1$ and $Y_2$ each represent an alkyl group having 2 or more carbon atoms; at least one of $R_1$, $R_2$, $R_3$, $R_4$, and $R_5$ and at least one of $Y_1$ and $Y_2$ may be taken together to form a ring; at least one of $R_1$, $R_2$, $R_3$, $R_4$, and $R_5$ and at least one of $R_6$ and $R_7$ may be taken together to form a ring; and the acid generator may consist of two or more structures represented by the following formula (I) linked up together at any one of $R_1$, $R_2$, $R_3$, $R_4$, $R_5$, $R_6$, and $R_7$ or any one of $Y_1$ and $Y_2$ via a linking group; and $X^-$ represents a non-nucleophilic anion.

2. The positive resist composition according to claim 1, wherein the polymer (A) comprises a repeating unit represented by the following formula (1):

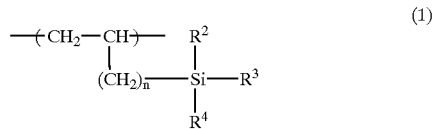

wherein $R^2$, $R^3$, and $R^4$ each represent an alkyl group, a haloalkyl group, a halogen atom, an alkoxy group, a trialkylsilyl group or a trialkylsilyloxy group; and n represents 0 or 1, and at least one of a repeating unit represented by the followgin formula (2a):

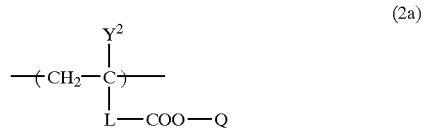

wherein $Y^2$ represents a hydrogen atom, an alkyl group, a cyano group or a halogen atom; L represents a single bond or a divalent linking group; and Q represents a group capable of generating a carboxylic acid on decomposing by an action of an acid, and a repeating unit represented by the following formula (2b):

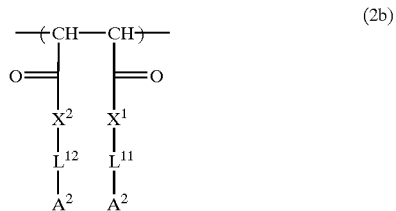

wherein $X^1$ and $X^2$ each represent an oxygen atom, a sulfur atom, —NH— or —NHSO$_2$—; $L^{11}$ and $L^{12}$ each represent a single bond or a divalent linking group; two $A^2$'s each represent a hydrogen atom, a cyano group, a hydroxyl group, —COOH, —COOR$^5$, —CO—NH—R$^6$, a substituted or unsubstituted alkyl group, an alkoxy group or —COOQ; $R^5$ and $R^6$ each represent a substituted or unsubstituted alkyl group; and Q represents a group capable of generating a carboxylic acid on decomposing by an action of an acid.

3. The positive resist composition according to claim 1, wherein the polymer (A) comprises a repeating unit represented by the following formula (1):

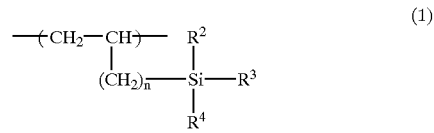

wherein $R^2$, $R^3$, and $R^4$ each represent an alkyl group, a haloalkyl group, a halogen atom, an alkoxy group, a trialkylsilyl group or a trialkylsilyloxy group; and n represents 0 or 1, at least one of a repeating unit represented by the followgin formula (2a):

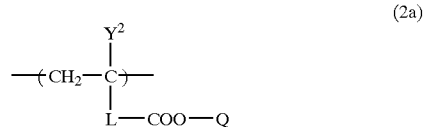

wherein $Y^2$ represents a hydrogen atom, an alkyl group, a cyano group or a halogen atom; L represents a single bond or a divalent linking group; and Q represents a group capable of generating a carboxylic acid on decomposing by an action of an acid, and a repeating unit represented by the following formula (2b):

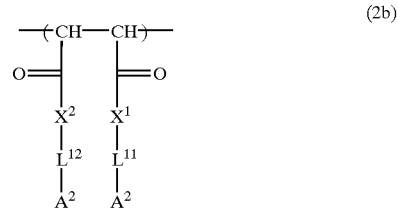

wherein $X^1$ and $X^2$ each represent an oxygen atom, a sulfur atom, —NH— or —NHSO$_2$—; $L^{11}$ and $L^{12}$ each represent a single bond or a divalent linking group; two $A^2$'s each represent a hydrogen atom, a cyano group, a hydroxyl group, —COOH, —COOR$^5$, —CO—NH—R$^6$, a substituted or unsubstituted alkyl group, an alkoxy group or —COOQ; $R^5$ and $R^6$ each represent a substituted or unsubstituted alkyl group; and Q represents a group capable of generating a carboxylic acid on decomposing by an action of an acid, and a repeating unit represented by the following formula (3):

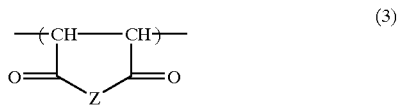

wherein Z represents —O— or —N(R$^7$)—; $R^7$ represents a hydrogen atom, a hydroxyl group, an alkyl group, a haloalkyl group or —OSO$_2$—R$^8$; and R$^8$ represents an alkyl group, a haloalkyl group, a cycloalkyl group or a camphor residue.

4. The positive resist composition according to claim 1, wherein the polymer (A) comprises a repeating unit represented by the following formula (4):

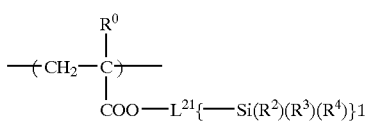

wherein $R^0$ represents a hydrogen atom, an alkyl group, a cyano group or a halogen atom; $L^{21}$ represents a divalent, trivalent or tetravalent linking group; $R^2$, $R^3$, and $R^4$ each represent an alkyl group, a haloalkyl group, a halogen atom, an alkoxy group, a trialkylsilyl group or a trialkylsilyloxy group; and 1 represents an integer of 1 to 3.

5. The positive resist composition according to claim 1, further comprising (C) an organic basic compound as an acid scavenger.

6. The positive resist composition according to claim 2, further comprising (C) an organic basic compound as an acid scavenger.

7. The positive resist composition according to claim 3, further comprising (C) an organic basic compound as an acid scavenger.

8. The positive resist composition according to claim 4, further comprising (C) an organic basic compound as an acid scavenger.

9. The positive resist composition according to claim 5, wherein the organic basic compound (C) is one of nitrogen-containing basic compounds represented by the following formulae (a) to (e):

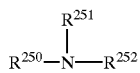

wherein $R^{250}$, $R^{251}$, and $R^{252}$, which may be the same or different, each represent a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms; $R^{251}$ and $R^{252}$ may be taken together to form a ring,

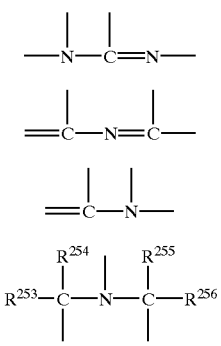

wherein $R^{253}$, $R^{254}$, $R^{255}$, and $R^{256}$, which may be the same or different, each represent an alkyl group having 1 to 6 carbon atoms.

10. The positive resist composition according to claim 6, wherein the organic basic compound (C) is one of nitrogen-containing basic compounds represented by the following formulae (a) to (e):

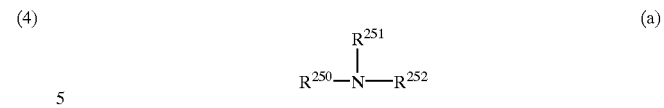

wherein $R^{250}$, $R^{251}$, and $R^{252}$, which may be the same or different, each represent a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms; $R^{251}$ and $R^{252}$ may be taken together to form a ring,

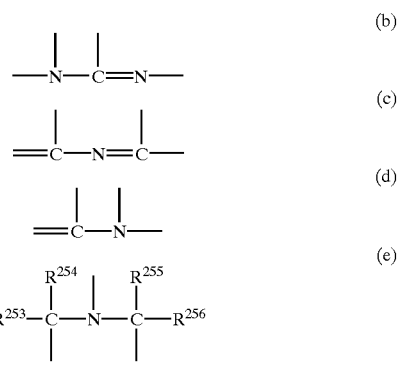

wherein $R^{253}$, $R^{254}$, $R^{255}$, and $R^{256}$, which may be the same or different, each represent an alkyl group having 1 to 6 carbon atoms.

11. The positive resist composition according to claim 7, wherein the organic basic compound (C) is one of nitrogen-containing basic compounds represented by the following formulae (a) to (e):

wherein $R^{250}$, $R^{251}$, and $R^{252}$, which may be the same or different, each represent a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms; $R^{251}$ and $R^{252}$ may be taken together to form a ring,

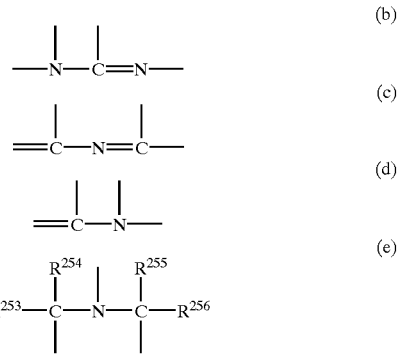

wherein $R^{253}$, $R^{254}$, $R^{255}$, and $R^{256}$, which may be the same or different, each represent an alkyl group having 1 to 6 carbon atoms.

12. The positive resist composition according to claim 8, wherein the organic basic compound (C) is one of nitrogen-containing basic compounds represented by the following formulae (a) to (e):

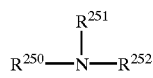

(a)

wherein $R^{250}$, $R^{251}$, and $R^{252}$, which may be the same or different, each represent a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms; $R^{251}$ and $R^{252}$ may be taken together to form a ring,

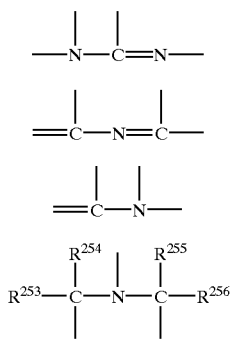

(b)

(c)

(d)

(e)

wherein $R^{253}$, $R^{254}$, $R^{255}$, and $R^{256}$, which may be the same or different, each represent an alkyl group having 1 to 6 carbon atoms.

13. The positive resist composition according to claim 5, wherein the organic basic compound (C) is a nitrogen-containing cyclic compound or a basic nitrogen-containing compounds having two or more nitrogen atoms in different chemical environments per molecule.

14. The positive resist composition according to claim 6, wherein the organic basic compound (C) is a nitrogen-containing cyclic compound or a basic nitrogen-containing compounds having two or more nitrogen atoms in different chemical environments per molecule.

15. The positive resist composition according to claim 7, wherein the organic basic compound (C) is a nitrogen-containing cyclic compound or a basic nitrogen-containing compounds having two or more nitrogen atoms in different chemical environments per molecule.

16. The positive resist composition according to claim 8, wherein the organic basic compound (C) is a nitrogen-containing cyclic compound or a basic nitrogen-containing compounds having two or more nitrogen atoms in different chemical environments per molecule.

\* \* \* \* \*